(12) United States Patent
Hong et al.

(10) Patent No.: US 11,402,715 B2
(45) Date of Patent: Aug. 2, 2022

(54) DISPLAY APPARATUS COMPRISING THIN FILM TRANSISTOR

(71) Applicant: LG Display Co., Ltd., Seoul (KR)

(72) Inventors: Yewon Hong, Paju-si (KR); KwangMin Jo, Paju-si (KR); JungHyun Lee, Paju-si (KR); Sohyung Lee, Paju-si (KR); Hyun Soo Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/108,598

(22) Filed: Dec. 1, 2020

(65) Prior Publication Data
US 2021/0181554 A1 Jun. 17, 2021

(30) Foreign Application Priority Data
Dec. 12, 2019 (KR) .......................... 10-2019-0165361

(51) Int. Cl.
*G02F 1/1368* (2006.01)
*G02F 1/1343* (2006.01)
(Continued)

(52) U.S. Cl.
CPC ........ *G02F 1/1368* (2013.01); *G02F 1/13439* (2013.01); *G02F 1/136209* (2013.01); *G02F 1/136295* (2021.01); *H01L 27/3262* (2013.01); *H01L 27/3265* (2013.01); *H01L 27/3272* (2013.01); *H01L 27/3276* (2013.01); *G09G 3/3233* (2013.01); *G09G 3/3266* (2013.01); *G09G 3/3275* (2013.01); *G09G 3/3677* (2013.01); *G09G 3/3688* (2013.01); *G09G 2300/0408* (2013.01); *H01L 27/124* (2013.01); *H01L 27/127* (2013.01);
(Continued)

(58) Field of Classification Search
CPC ............ G02F 1/1368; G02F 1/136295; G02F 1/136209; G02F 1/13439; H01L 27/3262; H01L 27/3265; H01L 27/3272; H01L 27/3276; H01L 29/66969; H01L 29/78633; H01L 29/7869; H01L 29/78696; G09G 3/3233; G09G 3/3266; G09G 3/3275
USPC ..................................... 349/42–48, 110–111
See application file for complete search history.

(56) References Cited

U.S. PATENT DOCUMENTS

| | | | |
|---|---|---|---|
| 2017/0322471 A1* | 11/2017 | Jeong ................ | G02F 1/136227 |
| 2020/0119120 A1* | 4/2020 | Feng ................... | H01L 27/3272 |
| 2020/0176699 A1* | 6/2020 | Lee ..................... | H01L 27/3276 |

FOREIGN PATENT DOCUMENTS

| KR | 10-2015-0101414 A | 9/2015 |
|---|---|---|
| KR | 10-1920770 B1 | 11/2018 |

* cited by examiner

*Primary Examiner* — Charles S Chang
(74) *Attorney, Agent, or Firm* — Seed IP Law Group LLP

(57) ABSTRACT

Disclosed is a display apparatus and a method for manufacturing the same, wherein the display apparatus comprises a substrate, a light shielding layer and a signal line on the substrate, a buffer layer on the light shielding layer and the signal line, an active layer on the buffer layer, a gate insulating film on the active layer, a gate electrode on the gate insulating film, a protection layer on the gate electrode, a first electrode of a display device on the protection layer, and a connection electrode configured to connect the signal line and the active layer with each other, wherein the light shielding layer and the signal line are disposed on the same layer, and the connection electrode and the first electrode are formed of the same material.

20 Claims, 19 Drawing Sheets

(51) Int. Cl.
  *H01L 27/32*  (2006.01)
  *G02F 1/1362*  (2006.01)
  *H01L 27/12*  (2006.01)
  *H01L 29/786*  (2006.01)
  *H01L 29/66*  (2006.01)
  *G09G 3/36*  (2006.01)
  *G09G 3/3233*  (2016.01)
  *G09G 3/3266*  (2016.01)
  *G09G 3/3275*  (2016.01)
(52) U.S. Cl.
  CPC ...... *H01L 27/1225* (2013.01); *H01L 27/1255* (2013.01); *H01L 29/66969* (2013.01); *H01L 29/7869* (2013.01); *H01L 29/78633* (2013.01); *H01L 29/78696* (2013.01); *H01L 2227/323* (2013.01)

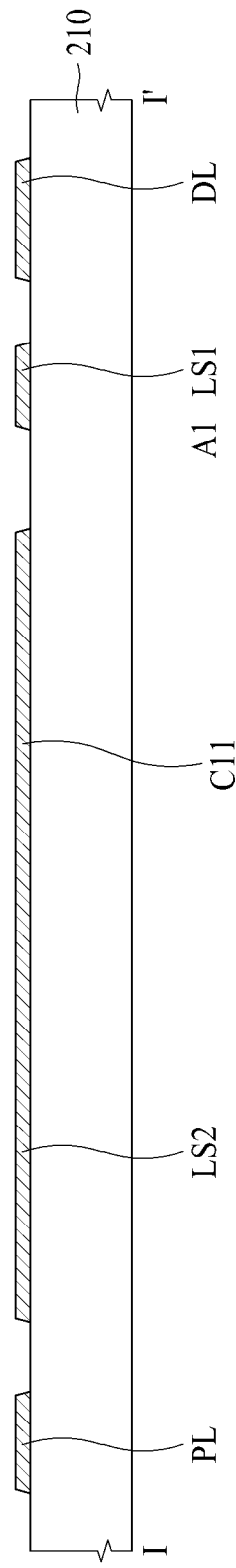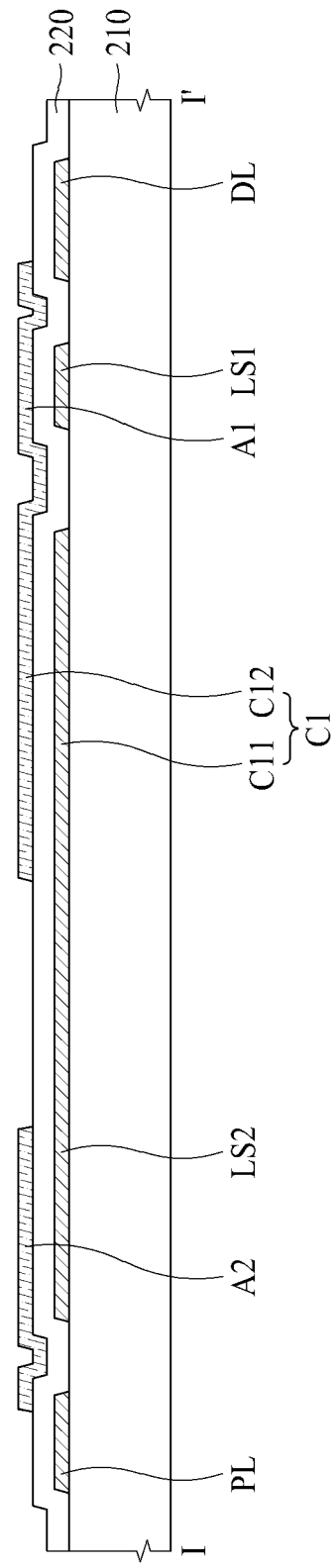

DISPLAY APPARATUS COMPRISING THIN FILM TRANSISTOR

CROSS-REFERENCE TO RELATED APPLICATIONS

This application claims the benefit of the Korean Patent Application No. 10-2019-0165361 filed on Dec. 12, 2019, which are hereby incorporated by reference as if fully set forth herein.

BACKGROUND

Technical Field

The present disclosure relates to a display apparatus and a method for manufacturing the same. In more detail, the present disclosure relates to a display apparatus capable of simplifying a structure and a manufacturing process, and a method for manufacturing the same.

Description of the Related Art

A display apparatus which displays various information on a screen is a technology-intensive apparatus in which core technologies of an information communication field are integrated. Recently, the display apparatus has been developed so as to realize thin profile, lightness, portability, and furthermore, high performance. Typical examples of the display apparatus may be a liquid crystal display (LCD) device and an organic light emitting diode display (OLED) device.

Generally, a mask process using a photo mask is carried out several times so as to manufacture the display apparatus. Each mask process requires cleaning, exposure, developing, and etching steps or the like. Accordingly, whenever one mask process is additionally carried out, it may cause the increase of manufacturing time and cost, and furthermore, it may cause the increase of possibility of defect and defect rate. As a result, a manufacturing yield is lowered.

BRIEF SUMMARY

In view of the technical problems faced in the related art, in order to lower the manufacturing costs and to improve production yield and efficiency, the inventors of the present disclosure have come up with a simplified display apparatus and a simplified process for manufacturing the display apparatus.

Another technical benefit of the present disclosure is to provide a method for manufacturing a display apparatus which facilitates to simplify a structure and a manufacturing process by omitting a process of forming source and drain electrodes for a thin film transistor, and a display apparatus manufactured by the same.

In accordance with an aspect of the present disclosure, the above and other technical benefits can be accomplished by the provision of a display apparatus comprising a substrate, a light shielding layer and a signal line on the substrate, a buffer layer on the light shielding layer and the signal line, an active layer on the buffer layer, a gate insulating film on the active layer, a gate electrode on the gate insulating film, a protection layer on the gate electrode, a first electrode of a display device on the protection layer, and a connection electrode configured to connect the signal line and the active layer with each other, wherein the light shielding layer and the signal line may be disposed on the same layer, and the connection electrode and the first electrode may be formed of the same material.

The connection electrode may be disposed on the same layer with that of the first electrode.

The light shielding layer may be formed of the same material as that of the signal line.

The signal line may include at least one of a data line and a driving power line.

The light shielding layer may be connected with the signal line.

The light shielding layer and the signal line may be formed as one body.

The gate insulating film may be disposed on an entire upper surface of the substrate including an upper surface of the active layer.

The active layer may be disposed between the gate electrode and the substrate.

The active layer may include an oxide semiconductor material.

The active layer may include a first oxide semiconductor layer on the buffer layer, and a second oxide semiconductor layer on the first oxide semiconductor layer.

The display apparatus may further comprise an emission layer disposed on the first electrode.

The display apparatus may further comprise a capacitor connected with the first electrode, wherein any one electrode of the capacitor is formed as one body with the light shielding layer.

The first electrode may be directly connected with the light shielding layer and the active layer.

The display apparatus may further comprise a liquid crystal layer disposed on the first electrode.

In accordance with another aspect of the present disclosure, there is provided a method for manufacturing a display apparatus comprising forming a light shielding layer and a signal line on a substrate, forming a buffer layer on the light shielding layer and the signal line, forming an active layer on the buffer layer, forming a gate insulating film on the active layer, forming a gate electrode on the gate insulating film, selectively providing conductivity to the active layer to selectively make conducting region in the active layer by using the gate electrode as a mask, forming a protection layer on the gate electrode, forming a first electrode of a display device on the protection layer, and forming a connection electrode configured to connect the signal line and the active layer with each other, wherein the light shielding layer and the signal line are manufactured by the same process using the same material, and the connection electrode and the first electrode are manufactured by the same process using the same material.

The step of selectively making the conducting region in the active layer may be carried out by a doping process.

The connection electrode may be formed in at least some portions of a contact hole penetrating through some portions of each of the protection layer, the gate insulating film and the buffer layer.

The first electrode may extend to at least some portions of a contact hole penetrating through some portions of each of the protection layer, the gate insulating film and the buffer layer, and the first electrode may be directly connected with the light shielding layer and the active layer.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings. In the drawings:

FIGS. 18A to 18G are cross sectional views illustrating a method for manufacturing the display apparatus according to one embodiment of the present disclosure.

DETAILED DESCRIPTION

Figure 1:
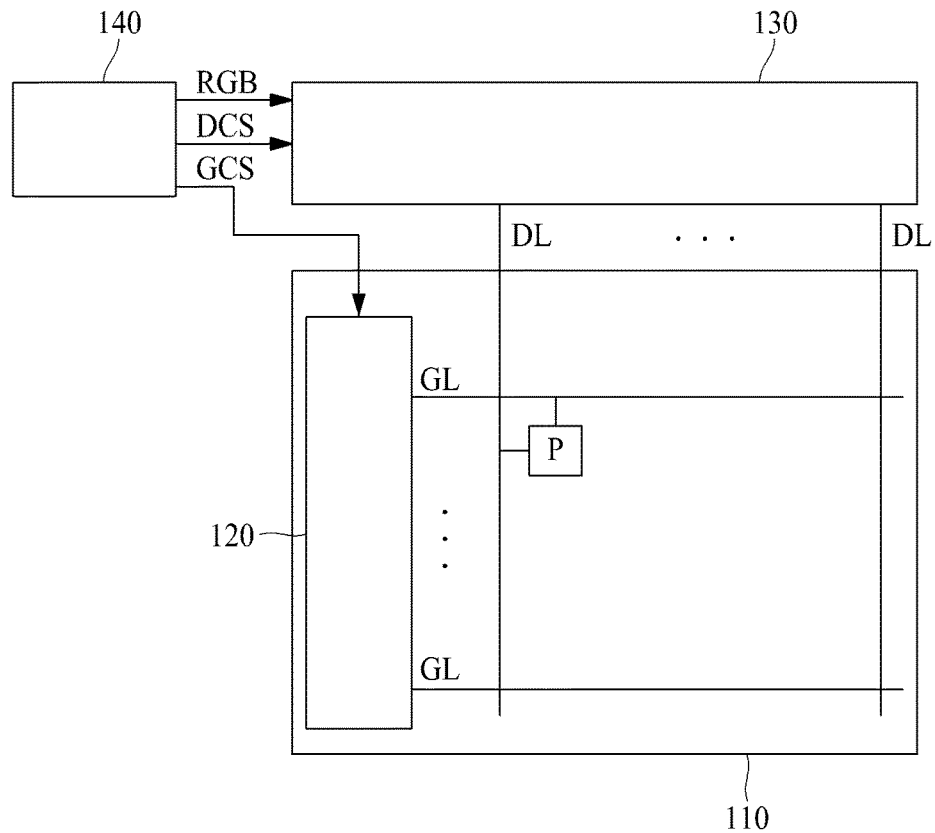
FIG. 1 is a schematic view illustrating a display apparatus according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure. The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a schematic view illustrating a display apparatus 100 according to one embodiment of the present disclosure.

As shown in FIG. 1, the display apparatus 100 according to one embodiment of the present disclosure includes a display panel 110, a gate driver 120, a data driver 130, and a controller 140.

The display panel 110 includes gate lines (GL) and data lines (DL), and a pixel (P) which is arranged at a crossing portion of the gate line (GL) and the data line (DL). The pixel (P) includes a display device 710, and a pixel driver (PDC) configured to drive the display device 710. An image is displayed on the display panel 110 by driving the pixel (P).

The controller 140 controls the gate driver 120 and the data driver 130.

The controller 140 outputs a gate control signal (GCS) for controlling the gate driver 120, and a data control signal (DCS) for controlling the data driver 130 by the use of vertically/horizontally synchronized signal and clock signal supplied from an external system (not shown). Also, the controller 140 samples input video data, which is provided from the external system, and then re-aligns the sampled video data, and supplies the re-aligned digital video data (RGB) to the data driver 130.

The gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

The data control signal (DCS) includes a source start pulse (SSP), a source shift clock signal (SSC), a source output enable signal (SOE), and a polarity control signal (POL).

The data driver 130 supplies a data voltage to the data lines (DL) of the display panel 110. In detail, the data driver 130 converts the video data (RGB) provided from the controller 140 into the data voltage, and supplies the data voltage to the data lines (DL).

The gate driver 120 sequentially supplies a gate pulse (GP) to the gate lines (GL) for 1 frame period. Herein, '1 frame' indicates the period in which an image is output through the use of display panel 110. Also, the gate driver 120 supplies a gate-off signal for turning off a switching device to the gate line (GL) for the remaining period of 1 frame in which the gate pulse (GP) is not supplied. Hereinafter, the gate pulse (GP) and the gate-off signal (Goff) are collectively referred to as scan signals (SS).

According to one embodiment of the present disclosure, the gate driver 120 may be provided on the display panel 110. A structure of directly providing the gate driver 120 on the display panel 110 may be referred to as Gate-In-Panel (GIP) structure.

Figure 2:
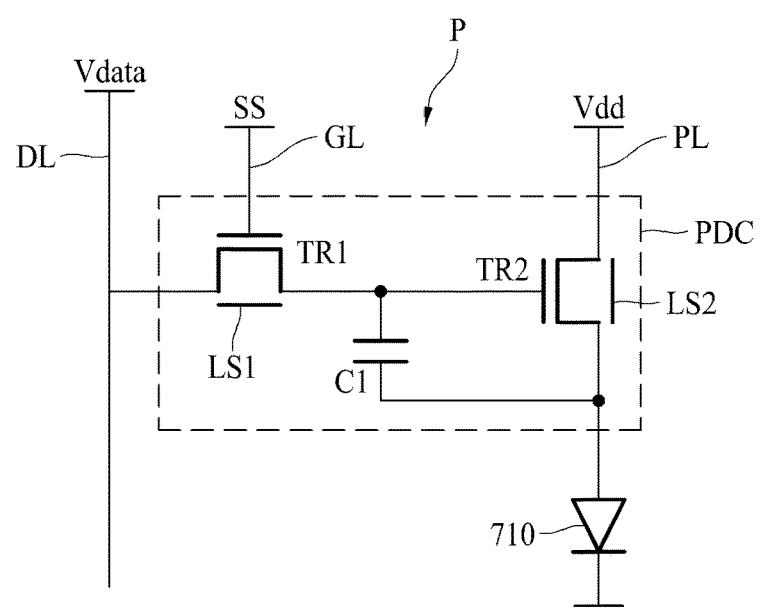
FIG. 2 is a circuit diagram for any one pixel of FIG. 1.
Figure 3:
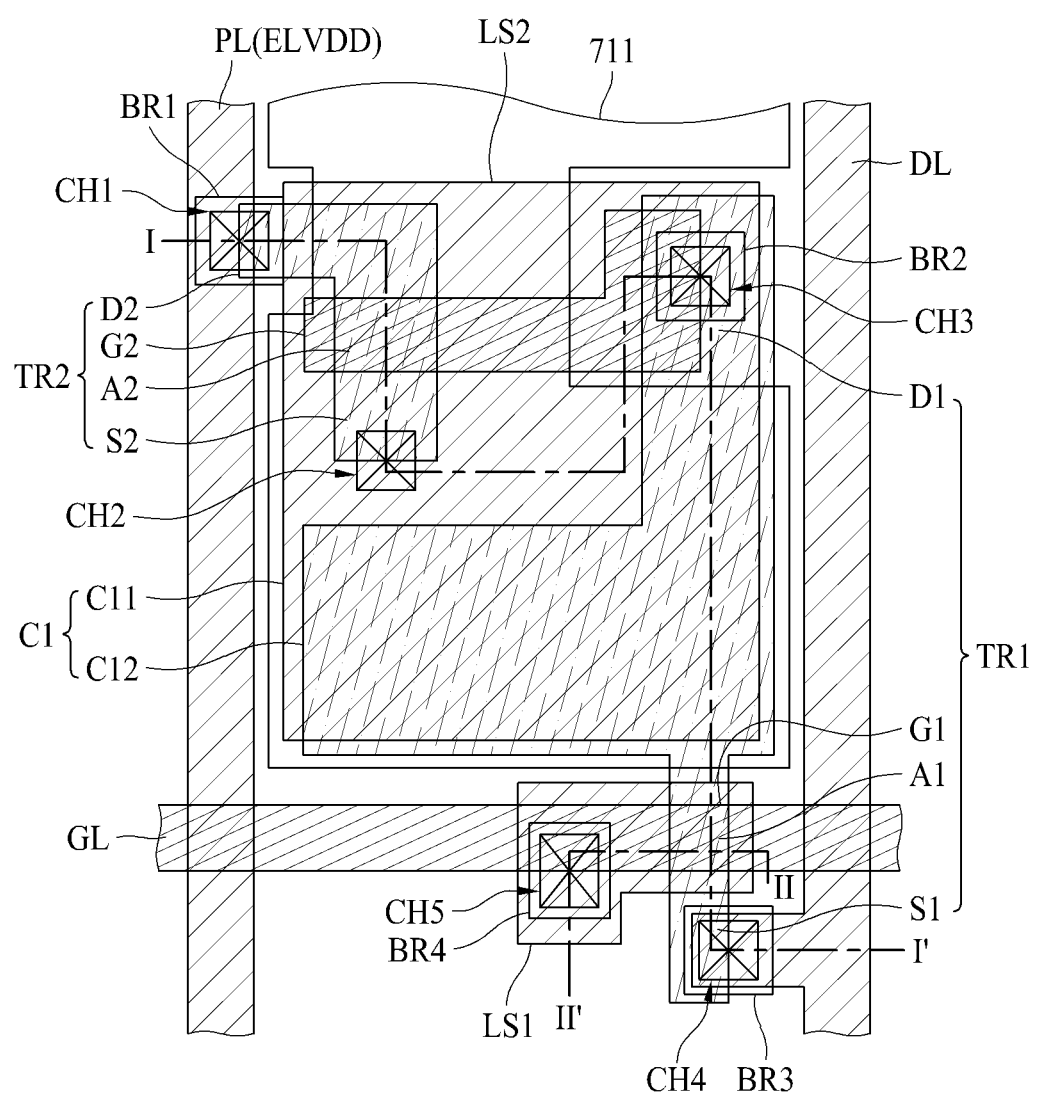
FIG. 3 is a plan view illustrating the pixel of FIG. 2.
Figure 4:
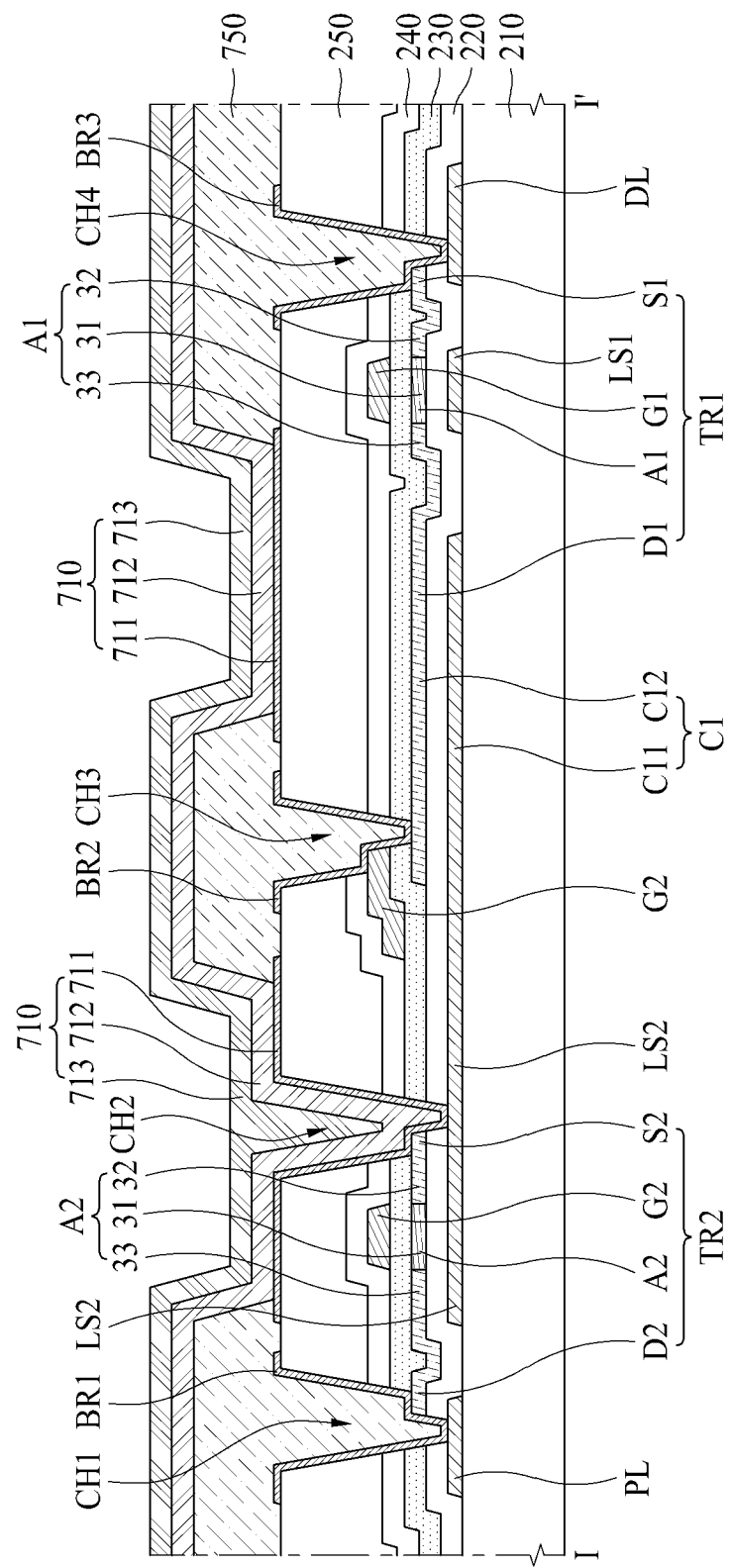
FIG. 4 is a cross sectional view along I-I' of FIG. 3.

FIG. 2 is a circuit diagram illustrating any one pixel (P) of FIG. 1, FIG. 3 is a plan view illustrating the pixel (P) of FIG. 2, and FIG. 4 is a cross sectional view along I-I' of FIG. 3.

Referring to FIGS. 2 and 3, and FIG. 4, the display apparatus 100 according to one embodiment of the present disclosure may include a substrate 210, a pixel driver (PDC) on the substrate 210, and a display device 710 (or emission device) connected with the pixel driver (PDC). The pixel driver (PDC) includes thin film transistors (TR1, TR2).

The circuit diagram of FIG. 2 corresponds to an equivalent circuit diagram for one pixel (P) in the display apparatus 100 comprising an organic light emitting diode (OLED) functioning as the emission device 710. Accordingly, the display apparatus 100 according to one embodiment of the present disclosure is an organic light emitting diode (OLED) display apparatus.

The pixel driver (PDC) of FIG. 2 includes a first thin film transistor (TR1) corresponding to a switching transistor, and a second thin film transistor (TR2) corresponding to a driving transistor.

The first thin film transistor (TR1) is connected with the gate line (GL) and the data line (DL), and the first thin film transistor (TR1) is turned-on or turned-off by the scan signal (SS) supplied through the gate line (GL).

The data line (DL) provides the data voltage (Vdata) to the pixel driver (PDC), and the first thin film transistor (TR1) controls applying the data voltage (Vdata).

A driving power line (PL) provides a driving voltage (Vdd) to the display device 710, and the second thin film transistor (TR2) controls the driving voltage (Vdd). Herein, the driving voltage (Vdd) is a pixel driving voltage for driving the organic light emitting diode (OLED) corresponding to the display device 710.

The data line (DL) and the driving power line (PL) are the lines for transmitting signals. Thus, according to one embodiment of the present disclosure, the data line (DL) and the driving power line (PL) may be referred to as signal lines. Also, the gate line (GL) transmits signals, whereby the gate line (GL) may be also referred to as a signal line.

When the first thin film transistor (TR1) is turned-on, the data voltage (Vdata), which is supplied through the data line (DL), is supplied to a gate electrode (G2) of the second thin film transistor (TR2) connected with the display device 710. The data voltage (Vdata) is charged in a first capacitor (C1) provided between a source electrode (S2) and the gate electrode (G2) of the second thin film transistor (TR2). The first capacitor (C1) corresponds to a storage capacitor (Cst).

An amount of current supplied to the organic light emitting diode (OLED) corresponding to the display device 710 through the second thin film transistor (TR2) is controlled in accordance with the data voltage (Vdd), whereby it is possible to control a grayscale of light emitted from the display device 710.

Referring to FIG. 4, the display apparatus 100 includes the substrate 210, a light shielding layer (LS1, LS2) and signal lines (DL, PL) on the substrate 210, a buffer layer 220 on the light shielding layer (LS1, LS2) and signal lines (DL, PL), an active layer (A1, A2) on the buffer layer 220, a gate insulating film 230 on the active layer (A1, A2), a gate electrode (G1, G2) on the gate insulating film 230, a protection layer 250 on the gate electrode (G1, G2), and a first electrode 711 of the display device 710 disposed on the protection layer 250. In the display apparatus 100 shown in FIG. 4, the first electrode 711 of the display device 710 corresponds to a pixel electrode.

The substrate 210 may be formed of glass or plastic. The substrate 210 may be formed of plastic having flexibility, for example, polyimide (PI).

The light shielding layer (LS1, LS2) and signal line (DL, PL) are disposed on the substrate 210.

The light shielding layer (LS1, LS2) has the light-blocking properties. The light shielding layer (LS1, LS2) is formed of a material capable of blocking light, for example, a metal material. The light shielding layer (LS1, LS2) prevents externally-provided incident light, and protects the active layer (A1, A2).

According to one embodiment of the present disclosure, the signal line may include at least one of the data line (DL) and the driving power line (PL). Referring to FIG. 4, the data line (DL) and the driving power line (PL) corresponding to the signal line may be disposed on the same layer as that of the light shielding layer (LS1, LS2).

The light shielding layer (LS1, LS2) may be formed of the same material as that of the signal line (DL, PL). The light shielding layer (LS1, LS2) and the signal line (DL, PL) may be manufactured by the same process.

Referring to FIG. 4, a first capacitor electrode (C11) of a first capacitor (C1) is disposed on the substrate 210. The first capacitor electrode (C11) of the first capacitor (C1) may be disposed on the same layer as that of the light shielding layer (LS1, LS2), and may be formed of the same material as that of the light shielding layer (LS1, LS2).

Also, the first capacitor electrode (C11) of the first capacitor (C1) may be formed as one body with the light shielding layer. For example, the first capacitor electrode (C11) of the first capacitor (C1) may be formed as one body with the second light shielding layer (LS2).

In FIG. 4, the light shielding layer (LS1, LS2) is spaced apart from the signal line (DL, PL), however, it is not limited to this structure. For example, the light shielding layer (LS1, LS2) may be connected with the signal line (DL, PL).

The buffer layer 220 is disposed on the light shielding layer (LS1, LS2) and the signal line (DL, PL). The buffer layer 220 is formed of an insulating material, and the buffer layer 220 protects the active layer (A1, A2) from externally-provided moisture or oxygen. The buffer layer 220 may be formed of an insulating material, for example, silicon oxide or silicon nitride.

The active layers (A1, A2) of the first thin film transistor (TR1) and the second thin film transistor (TR2) are disposed on the buffer layer 220. At least some portions of the active layer (A1) of the first thin film transistor (TR1) may be overlapped with the first light shielding layer (LS1). Also, at least some portions of the active layer (A2) of the second thin film transistor (TR2) may be overlapped with the second light shielding layer (LS2).

According to one embodiment of the present disclosure, the active layer (A1, A2) may include an oxide semiconductor material. For example, the active layer (A1, A2) may include at least one among IZO(InZnO)-based oxide semiconductor, IGO(InGaO)-based oxide semiconductor, GO(GaO)-based oxide semiconductor, ITO(InSnO)-based oxide semiconductor, IGZO(InGaZnO)-based oxide semiconductor, IGTO(InGaSnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor. However, one embodiment of the present disclosure is not limited to the above materials. The active layer (A1, A2) may be formed of other oxide semiconductor materials generally known to those in the art.

According to one embodiment of the present disclosure, the active layer (A1, A2) may include the first active layer (A1) and the second active layer (A2) which are disposed on the same layer and are spaced apart from each other.

The first active layer (A1) serves as the active layer of the first thin film transistor (TR1), and the second active layer (A2) serves as the active layer of the second thin film transistor (TR2).

Referring to FIG. 4, the gate insulating film 230 is disposed on the active layer (A1, A2). The gate insulating film 230 has the insulating properties. The gate insulating film 230 may be patterned together with the gate electrode (G1, G2), or not.

According to one embodiment of the present disclosure, as shown in FIG. 4, the gate insulating film 230 may be disposed on an entire upper surface of the substrate 210 including an upper surface of the active layer (A1, A2). In this case, the gate insulating film 230 is not patterned.

The gate electrode (G1, G2) is disposed on the gate insulating film 230. The gate electrode (G1, G2) may be portions extended from the gate line (GL), or may be some portions of the gate line (GL). The gate electrode (G1, G2) may include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The gate electrode (G1, G2) may have a multi-layered structure including at least two layers with the different physical properties.

By a selective conducting process using the gate electrode (G1, G2) as a mask, some regions of the active layer (A1, A2) are conductorized and thus become conducting regions. In an embodiment of the present disclosure, "conductorize" means "providing conductivity".

A region of the active layer (A1, A2), which is overlapped with the gate electrode (G1, G2), is not provided with conductivity and thus does not become the conducting region, but become a channel region 31. Some regions of the active layer (A1, A2), which are not overlapped with the gate electrode (G1, G2), are provided with conductivity and thus become the conducting regions 32 and 33. Generally, the conducting regions 32 and 33 are formed at both sides of the channel region 31.

According to one embodiment of the present disclosure, some regions of the active layer (A1, A2) may be provided with conductivity and thus become the conducting regions by a doping process using dopant. In this case, doped regions become the conducting regions, and the some regions of the active layer (A1, A2) may be doped with the dopant through the gate insulating film 230. Thus, even though the active layer (A1, A2) is not exposed to the external from the gate insulating film 230, a selective doping for the active layer (A1, A2) is possible. According to one embodiment of the present disclosure, it is possible not to pattern the gate insulating film 230.

Any one of the conducting regions 32 and 33 becomes a source region 32, and the other becomes a drain region 33. The source region 32 serves as a source connection region connected with the source electrode (S1, S2), or the source region 32 itself serves as the source electrode (S1, S2). The drain region 33 serves as a drain connection region connected with the drain electrode (D1, D2), or the drain region 33 itself serves as the drain electrode (D1, D2).

According to one embodiment of the present disclosure, the source region 32 and the drain region 33 are distinguished from each other, for convenience of explanation. However, the source region 32 and the drain region 33 are used interchangeably. According to a voltage, the source region 32 becomes the drain region 33, and the drain region 33 becomes the source region 32. Also, the source region 32 becomes the source electrode (S1, S2) or the drain electrode (D1, D2), and the drain region 33 becomes the drain electrode (D1, D2) or the source electrode (S1, S2).

For convenience of explanation, according to one embodiment of the present disclosure, the source region 32 is referred to as the source electrode (S1, S2), and the drain region 33 is referred to as the drain electrode (D1, D2).

According to one embodiment of the present disclosure, some portions of the conducting region 32 and 33 serve as a capacitor electrode. For example, referring to FIG. 4, some portions of the drain connection region 33 in the conducting region 32 and 33 of the first active layer (A1) may serve as the second capacitor electrode (C12) of the first capacitor (C1). The second capacitor electrode (C12) of the first capacitor (C1) is overlapped with the first capacitor electrode (C11), to thereby form the first capacitor (C1).

Referring to FIG. 4, any one electrode (C11) of the first capacitor (C1) may be formed as one body with the second light shielding layer (LS2), and the other electrode (C12) of the first capacitor (C1) may be formed as one body with the first active layer (A1).

Referring to FIG. 4, the passivation layer 240 is disposed on the gate electrode (G1, G2). The passivation layer 240 protects the active layer (A1, A2) and the gate electrode (G1, G2).

Generally, the source electrode and the drain electrode are disposed on the passivation layer 240. However, according to one embodiment of the present disclosure, additional source and drain electrodes are not disposed on the passivation layer 240. Thus, according to one embodiment of the present disclosure, it is possible to omit a patterning process for forming the source electrode and the drain electrode. As a result, it is possible to simplify a manufacturing process of the display apparatus 100.

The protection layer 250 is disposed on the passivation layer 240. The protection layer 250 is provided to planarize upper surfaces of the gate electrode (G1, G2), and to protect the pixel driver (PDC), whereby the protection layer 250 may be referred to as a planarization layer.

Referring to FIG. 4, the display device 710 is disposed on the protection layer 250. In detail, the first electrode 711 of the display device 710 is disposed on the protection layer 250, and the emission layer 712 and the second electrode 713 are sequentially disposed on the first electrode 711, to thereby form the display device 710. In FIG. 4, the first electrode 711 is a pixel electrode, and the second electrode 713 is a common electrode.

The first electrode 711 of the display device 710 is directly connected with the second active layer (A2) and any one light shielding layer through a contact hole (CH2). In detail, the first electrode 711 is in contact with the second light shielding layer (LS2), and is also in contact with the source region 32 of the second active layer (A2) through the second contact hole (CH) formed in the protection layer 250, the passivation layer 240, the gate insulating film 230, and the buffer layer 220. According to one embodiment of the present disclosure, the source region 32 of the second active layer (A2) serves as the second source electrode (S2). Thus, the first electrode 711 may be in direct contact with the source electrode (S2) of the second thin film transistor (TR2). Also, some portions of the second light shielding layer (LS2) may serve as the first capacitor electrode (C11). Thus, the second source electrode (S2) and the first capacitor electrode (C11) are connected with each other by the first electrode 711 positioned in the second contact hole (CH2).

Also, a connection electrode (BR1, BR2, BR3) is disposed on the protection layer 250.

The connection electrode (BR1, BR2, BR3) is formed of the same material as that of the first electrode 711. Also, the connection electrode (BR1, BR2, BR3) and the first electrode 711 are disposed on the same layer. The connection electrode (BR1, BR2, BR3) and the first electrode 711 may be manufactured by the same process.

The connection electrode (BR1, BR3) is provided to connect the signal line (DL, PL) with the active layer (A1, A2). In detail, the first connection electrode (BR1) connects the driving power line (PL) with the second active layer (A2). A first contact hole (CH1) is provided to connect the driving power line (PL) and the second active layer (A2) with each other, and the first connection electrode (BR1) is formed in the first contact hole (CH1). Referring to FIG. 4, the first connection electrode (BR1) is in contact with the driving power line (PL), and is also in contact with the drain region 33 of the second active layer (A2), at the same time. According to one embodiment of the present disclosure, the drain region 33 of the second active layer (A2) serves as the second drain electrode (D2). Thus, the first connection electrode (BR1) is provided to connect the driving power line (PL) with the drain electrode (D2) of the second thin film transistor (TR2).

The third connection electrode (BR3) is provided to connect the data line (DL) with the first active layer (A1). For the connection between the data line (DL) and the first active layer (A1), a fourth contact hole (CH4) is provided. Referring to FIG. 4, the third connection electrode (BR3) is in contact with the data line (DL), and is also in contact with the source region 32 of the first active layer (A1), at the same time. According to one embodiment of the present disclosure, the source region 32 of the first active layer (A1) serves as the first source electrode (S1). Thus, the third connection electrode (BR3) is provided to connect the data line (DL) with the source electrode (S1) of the first thin film transistor (TR1).

Also, the second connection electrode (BR2) connects the second gate electrode (G2) with the first active layer (A1). A third contact hole (CH3) is provided to connect the second gate electrode (G2) with the first active layer (A1). Referring to FIG. 4, the second connection electrode (BR2) is in contact with the second gate electrode (G2), and is also in contact with the drain region 33 of the first active layer (A1), at the same time. According to one embodiment of the present disclosure, the drain region 33 of the first active layer (A1) functions as the first drain electrode (D1), and some portions overlapped with the first capacitor electrode (C11) function as the second capacitor electrode (C12). Thus, the second connection electrode (BR2) is provided to connect the drain electrode (D1) of the first thin film transistor (TR1) with the second gate electrode (G2), and to connect the second capacitor electrode (C12) with the second gate electrode (G2), at the same time.

A bank layer 750 is disposed on the periphery of the first electrode 711. In some embodiments, the bank layer 750 is formed at the periphery of an emission area of the display device 710.

The emission layer 712 is disposed on the first electrode 711. Herein, the emission layer 712 is an organic emission layer including an organic material. The second electrode 713 is disposed on the emission layer 712. Accordingly, it is possible to formulate the display device 710.

The display device 710 shown in FIG. 4 corresponds to an organic light emitting diode (OLED). Thus, the display apparatus 100 according to one embodiment of the present disclosure corresponds to an organic light emitting diode (OLED) display apparatus.

According to one embodiment of the present disclosure, the thin film transistors (TR1, TR2) are formed by the active layer (A1, A2) and the gate electrode (G1, G2). The thin film transistors (TR1, TR2) are connected with the signal lines (PL, DL) by the use of connection electrodes (BR1, BR3).

In the first thin film transistor (TR1), the source region 32 of the first active layer (A1) becomes the source electrode (S1), and the drain region 33 becomes the drain electrode (D1). In the second thin film transistor (TR2), the source region 32 of the second active layer (A2) becomes the source electrode (S2), and the drain region 33 becomes the drain electrode (D2).

As shown in FIGS. 2 and 4, the first thin film transistor (TR1) serves as a switching transistor configured to control the data voltage (Vdata) applied to the pixel driver (PDC). The second thin film transistor (TR2) serves as a driving transistor configured to control the driving voltage (Vdd) applied to the display device 710.

According to one embodiment of the present disclosure, as shown in FIG. 4, the active layer (A1, A2) is disposed between the gate electrode (G1, G2) and the substrate 210. As shown in FIG. 4, if the substrate 210 is the bottom, a structure of the thin film transistor where the gate electrode (G1, G2) is disposed above the active layer (A1, A2) is referred to as a top gate structure.

Meanwhile, in contrast to the top gate structure, a structure of the thin film transistor where the gate electrode (G1, G2) is disposed below the active layer (A1, A2) is referred to as a bottom gate structure.

In case of the thin film transistor of the bottom gate structure, a capacitance is generated between the gate electrode and the source electrode or between the gate electrode and the drain electrode. Thus, in order to turn on the thin film transistor, a relatively high voltage has to be applied to the bottom gate structure in comparison to the top gate structure, whereby it has a disadvantage of a large power consumption.

Meanwhile, in comparison to the bottom gate structure, the thin film transistor of the top gate structure has an advantage of a relatively small power consumption. However, in case of the top gate structure, it has disadvantages of a multi-layered structure for a manufacturing process, and a large size of the thin film transistor.

However, according to one embodiment of the present disclosure, the active layer (A1, A2) is in contact with the signal line (PL, DL) by the use of connection electrode (BR1, BR3) without forming the additional source and drain electrodes. Accordingly, according to one embodiment of the present disclosure, it is possible to decrease the number of steps for forming the thin film transistors, and also to decrease the number of deposited layers, whereby the number of contact holes is decreased, to thereby lower a manufacturing cost and to decrease an occupying size of the thin film transistor.

According to one embodiment of the present disclosure, it is possible to improve an aperture ratio of the display apparatus 100.

Figure 5:
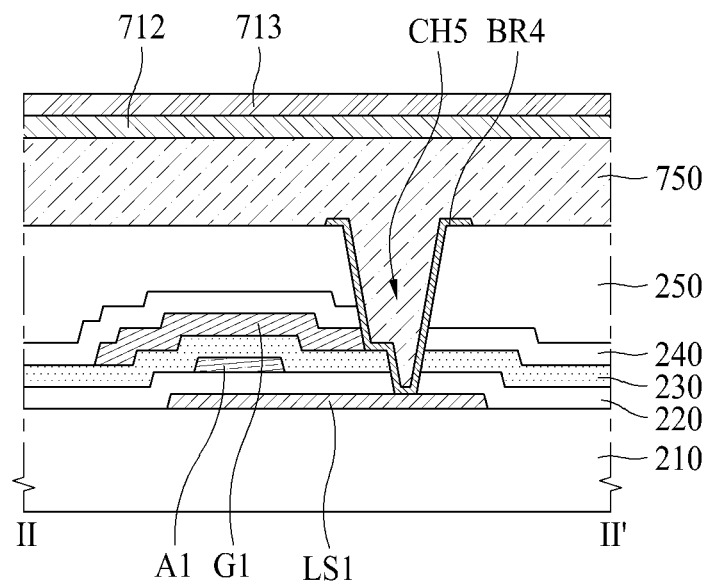
FIG. 5 is a cross sectional view along II-II' of FIG. 3.

FIG. 5 is a cross sectional view along II-II' of FIG. 3.

Referring to FIG. 5, the first light shielding layer (LS1) is connected with the first gate electrode (G1) by the use of fourth connection electrode (BR4). A fourth contact hole (CH4) is provided to connect the first light shielding layer (LS1) with the first gate electrode (G1).

According as the first light shielding layer (LS1) is connected with the first gate electrode (G1), it is possible to prevent the first light shielding layer (LS1) from being in an unstable floating state. Also, according as the first light shielding layer (LS1) is connected with the first gate electrode (G1), it may have an occurrence of effect that happens when the gate electrode is disposed at both sides of the first active layer (A1), whereby it is possible to increase a turning-on current of the first thin film transistor.

Figure 6:
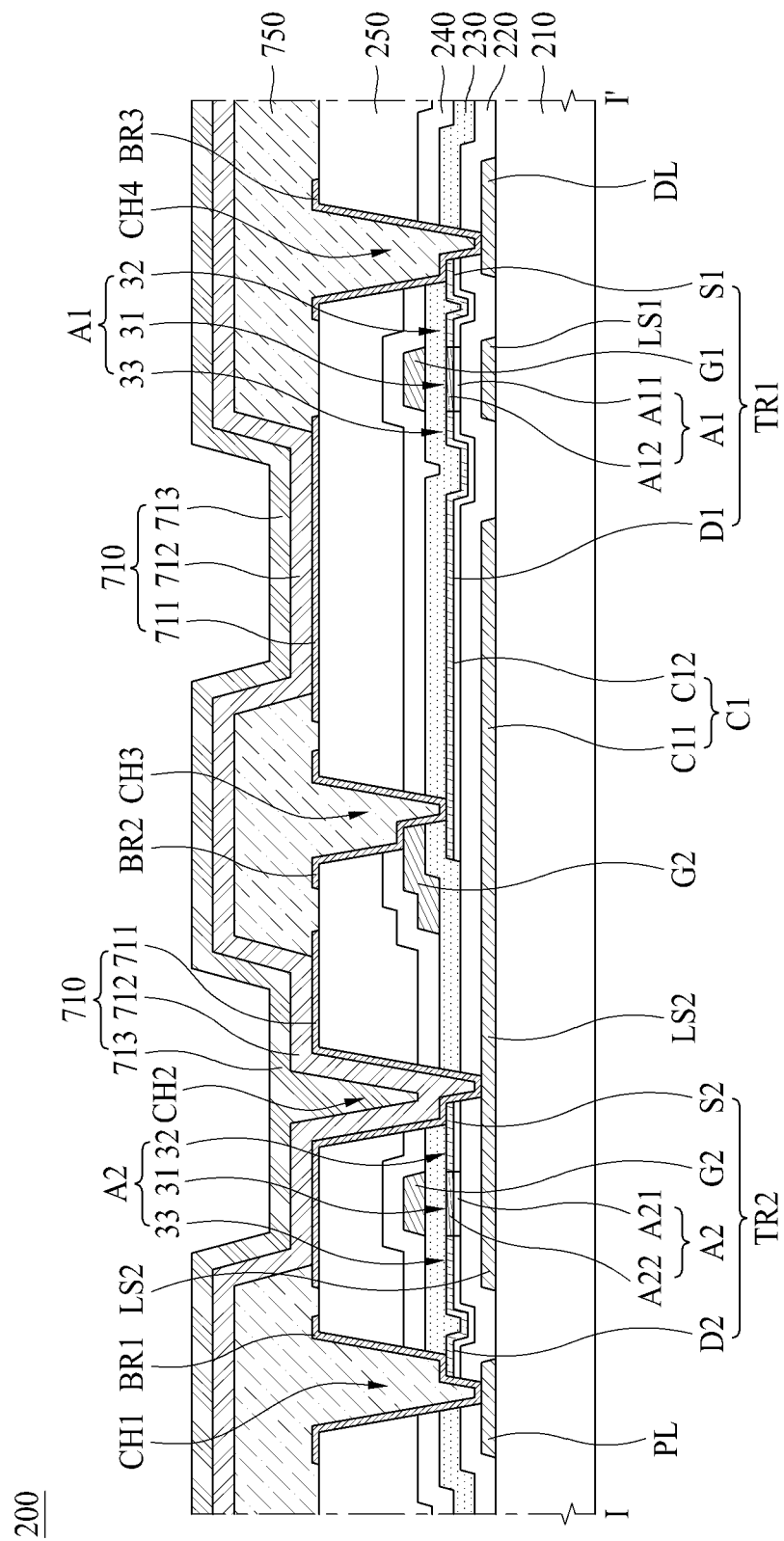
FIG. 6 is a cross sectional view illustrating a pixel of a display apparatus according to another embodiment of the present disclosure.

FIG. 6 is a cross sectional view illustrating a pixel of a display apparatus 200 according to another embodiment of the present disclosure.

In the display apparatus 200 shown in FIG. 6, an active layer (A1, A2) has a multi-layered structure. Referring to FIG. 6, the active layer (A1, A2) includes a first oxide semiconductor layer (A11, A21) on a buffer layer 220, and a second oxide semiconductor layer (A12, A22) on the first oxide semiconductor layer (A11, A21). In more detail, the first active layer (A1) includes the first oxide semiconductor layer (A11) on the buffer layer 220, and the second oxide semiconductor layer (A12) on the first oxide semiconductor layer (A11). The second active layer (A2) includes the first oxide semiconductor layer (A21) on the buffer layer 220, and the second oxide semiconductor layer (A22) on the first oxide semiconductor layer (A21).

According to one embodiment of the present disclosure, the first oxide semiconductor layer (A11, A21) serves as a support layer configured to support the second oxide semiconductor layer (A12, A22), and the second oxide semiconductor layer (A12, A22) serves as a channel layer. Typically, a channel of the active layer (A1, A2) is provided in the second oxide semiconductor layer (A12, A22).

For improvement of the film stability, the first oxide semiconductor layer (A11, A21), which serves as the support layer, may include gallium (Ga), wherein gallium (Ga) forms a stabilized bond to oxygen, whereby the first oxide semiconductor layer (A11, A21) has good film stability. According to one embodiment of the present disclosure, the first oxide semiconductor layer (A11, A21) may include at least one among IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material. However, one embodiment of the present disclosure is not limited to the above materials. The first oxide semiconductor layer (A11, A21) may be formed of other oxide semiconductor materials generally known to those in the art.

The second oxide semiconductor layer (A12, A22) may include at least one among IZO(InZnO)-based oxide semiconductor, IGO(InGaO)-based oxide semiconductor, ITO (InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor. However, one embodiment of the present disclosure is not limited to the above materials. The second oxide semiconductor layer (A12, A22) may be formed of other oxide semiconductor materials generally known to those in the art.

The second oxide semiconductor layer (A12, A22) has the electrical properties which are greater than that of the first oxide semiconductor layer (A11, A21), and the first oxide semiconductor layer (A11, A21) may have the greater film stability and greater tolerance to etching in comparison to the second oxide semiconductor layer (A21, A22).

Figure 7:
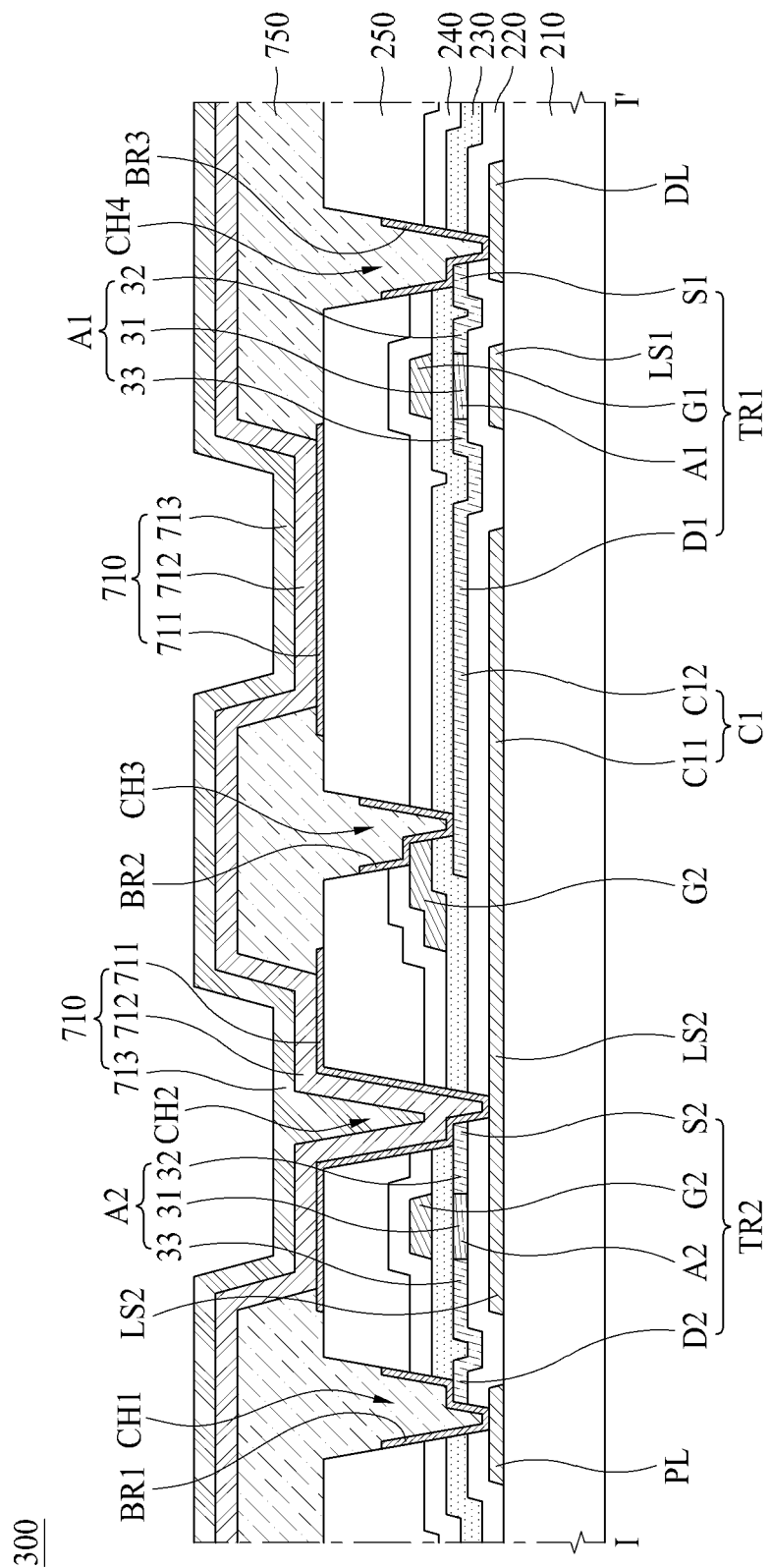
FIG. 7 is a cross sectional view illustrating a pixel of a display apparatus according to another embodiment of the present disclosure.

FIG. 7 is a cross sectional view illustrating a pixel of a display apparatus 300 according to another embodiment of the present disclosure.

In comparison to FIG. 4, a connection electrode (BR1, BR2, BR3) of FIG. 7 does not extend to an upper surface of a protection layer 250. In detail, a first connection electrode (BR1) connects a driving power line (PL) with a second active layer (A2), however, the first connection electrode (BR1) does not extend to the upper surface of the protection layer 250. A third connection electrode (BR3) connects a data line (DL) with a first active layer (A1), however, the third connection electrode (BR3) does not extend to the upper surface of the protection layer 250. A second connection electrode (BR2) connects a second gate electrode (G2) with the first active layer (A1), however, the second connection electrode (BR2) does not extend to the upper surface of the protection layer 250.

As shown in FIG. 7, the connection electrode (BR1, BR2, BR3) may be formed in a minimum size which allows an electrical connection function. In this case, an occupying area of the connection electrode (BR1, BR2, BR3) is decreased so that an occupying area of a first electrode 711 which functions as a pixel electrode is increased, to thereby improve an aperture ratio of the display apparatus 300.

Figure 8:
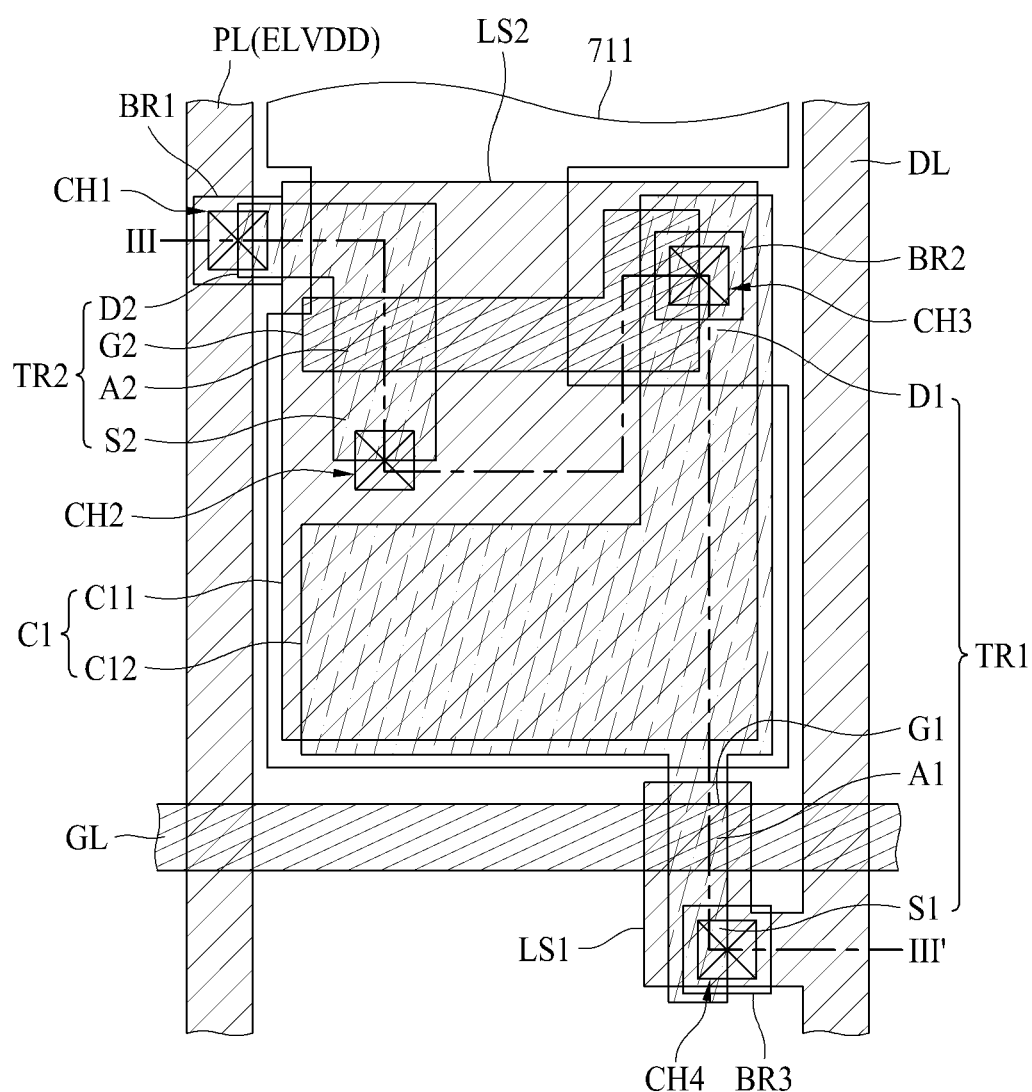
FIG. 8 is a plan view illustrating a pixel of a display apparatus according to another embodiment of the present disclosure.
Figure 9:
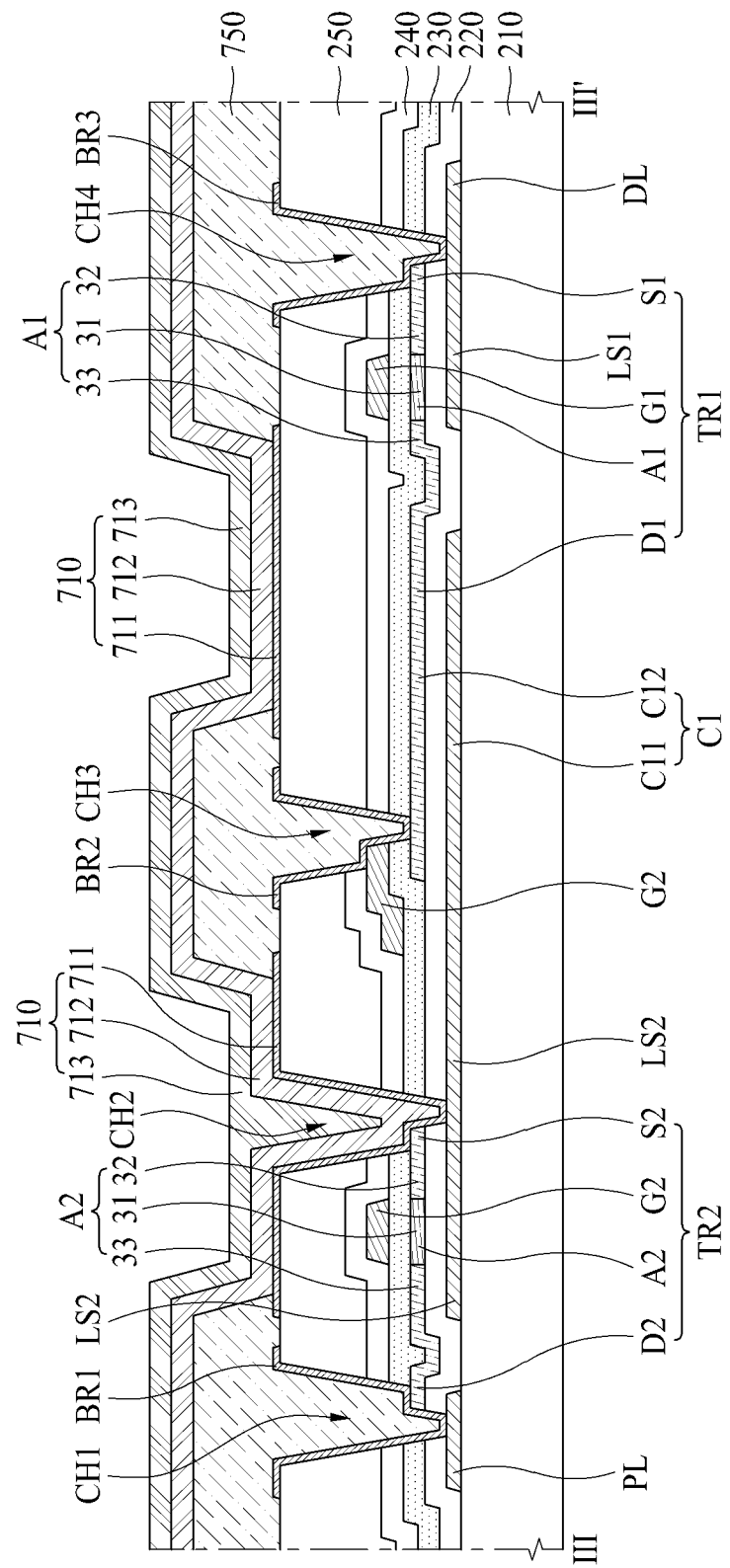
FIG. 9 is a cross sectional view along of FIG. 8.

FIG. 8 is a plan view illustrating a pixel of a display apparatus 400 according to another embodiment of the present disclosure. FIG. 9 is a cross sectional view along of FIG. 8.

Referring to FIGS. 8 and 9, a data line (DL) and a first light shielding layer (LS1) are formed as one body. According to one embodiment of the present disclosure, a signal line (DL) and a light shielding layer (LS) may be formed as one body.

Referring to FIGS. 8 and 9, if the signal line and the light shielding layer are formed as one body, it is possible to omit a connection electrode (see 'BR4' of FIGS. 3 and 5) and a contact hole (see 'CH5' of FIGS. 3 and 5) provided to connect the signal line and the light shielding layer with each other.

In detail, in case of the display apparatus 400 shown in FIGS. 8 and 9, it is possible to omit a fourth connection electrode (BR4) and a fifth contact hole (CH5) provided to connect a first gate electrode (G1) and a first light shielding layer (LS1) with each other, as compared with FIGS. 3 and 5. According as the first light shielding layer (LS1) is formed as one body with a data line (DL), it is possible to prevent the first light shielding layer (LS1) from being left in an unstable floating state.

Figure 10:
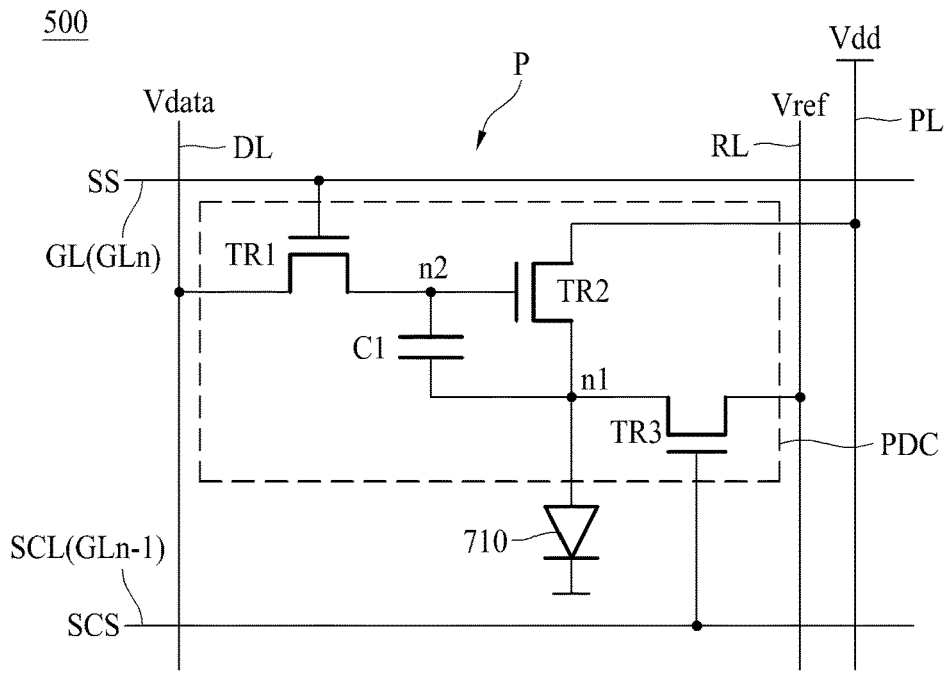
FIG. 10 is a circuit diagram for any one pixel of a display apparatus according to another embodiment of the present disclosure.

FIG. 10 is a circuit diagram for any one pixel of a display apparatus 500 according to another embodiment of the present disclosure. FIG. 10 is an equivalent circuit diagram for a pixel (P) of an organic light emitting display apparatus.

The pixel (P) of the display apparatus 500 shown in FIG. 10 includes an organic light emitting diode (OLED), which is a display device 710, and a pixel driver (PDC) configured to drive the display device 710. The display device 710 is connected with the pixel driver (PDC).

In the pixel (P), there are signal lines (DL, GL, PL, RL, SCL) configured to supply signals to the pixel driver (PDC).

A data voltage (Vdata) is supplied to a data line (DL), a scan signal (SS) is supplied to a gate line (GL), a driving voltage (Vdd) for driving the pixel is supplied to a driving power line (PL), a reference voltage (Vref) is supplied to a reference line (RL), and a sensing control signal (SCS) is supplied to a sensing control line (SCL).

Referring to FIG. 10, when the gate line of the (n)th pixel (P) is referred to as "GLn", the gate line of the neighboring (n−1)th pixel (P) is "$GL_{n-1}$", and "$GL_{n-1}$" corresponding to the gate line of the (n−1)th pixel (P) serves as the sensing control line (SCL) of the (n)th pixel (P).

For example, as shown in FIG. 10, the pixel driver (PDC) includes a first thin film transistor (TR1, switching transistor) connected with the gate line (GL) and the data line (DL), a second thin film transistor (TR2, e.g., driving transistor) configured to control a level of current which is provided to the display device 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display device 710 and a gate electrode (G2) of the second thin film transistor (TR2). The first capacitor (C1) is referred to as a storage capacitor (Cst).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) between the display device 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, the current is supplied to the display device 710 through the second thin film transistor (TR2) by the driving voltage (Vdd) for driving the pixel, whereby light is emitted from the display device 710.

Figure 11:
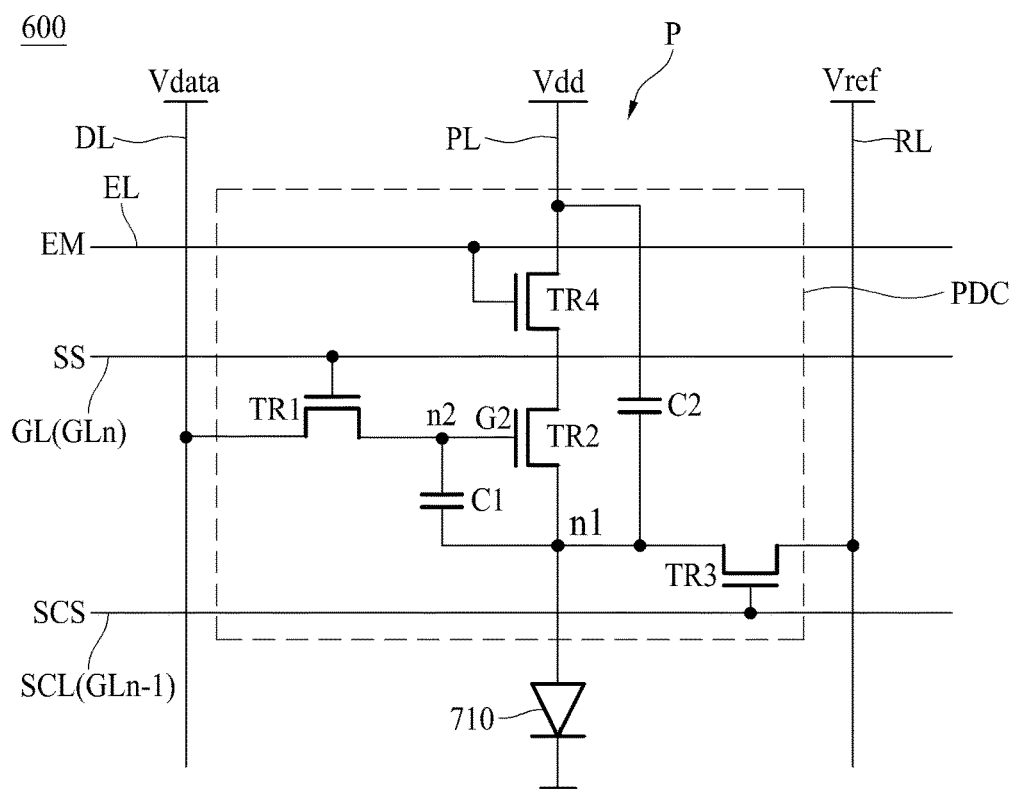
FIG. 11 is a circuit diagram for any one pixel of a display apparatus according to another embodiment of the present disclosure.

FIG. 11 is a circuit diagram illustrating a pixel (P) applied to a display apparatus 600 according to another embodiment of the present disclosure.

The pixel (P) of the display apparatus 600 shown in FIG. 11 includes an organic light emitting diode (OLED) corresponding to a display device 710, and a pixel driver (PDC) configured to drive the display device 710. The display device 710 is connected with the pixel driver (PDC).

The pixel driver (PDC) includes thin film transistors (TR1, TR2, TR3, TR4).

In the pixel (P), there are signal lines (DL, EL, GL, PL, SCL, RL) configured to supply driving signals to the pixel driver (PDC).

In comparison to the pixel (P) of FIG. 10, the pixel (P) of FIG. 11 further includes an emission control line (EL). An emission control signal (EM) is supplied to the emission control line (EL).

Also, in comparison to the pixel driver (PDC) of FIG. 10, the pixel driver (PDC) of FIG. 11 further includes a fourth thin film transistor (TR4) corresponding to an emission control transistor configured to control a light emission time point of the second thin film transistor (TR2).

Referring to FIG. 11, when the gate line of the (n)th pixel (P) is referred to as "$GL_n$", the gate line of the neighboring (n−1)th pixel (P) is "$GL_{n-1}$", and "$GL_{n-1}$" corresponding to the gate line of the (n−1)th pixel (P) serves as the sensing control line (SCL) of the (n)th pixel (P).

A first capacitor (C1) is positioned between the display device 710 and a gate electrode (G2) of the second thin film transistor (TR2). Also, a second capacitor (C2) is positioned between one electrode of the display device 710 and a terminal supplied with a driving voltage (Vdd) among terminals of the fourth thin film transistor (TR4).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with a reference line (RL) and the first node n1 between the display device 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned-on, the current is supplied to the second thin film transistor (TR2), whereby light is emitted from the display device 710.

The pixel driver (PDC) according to another embodiment of the present disclosure may be formed in various structures in addition to the above-described structure. For example, the pixel driver (PDC) may include five thin film transistors or more.

Figure 12:
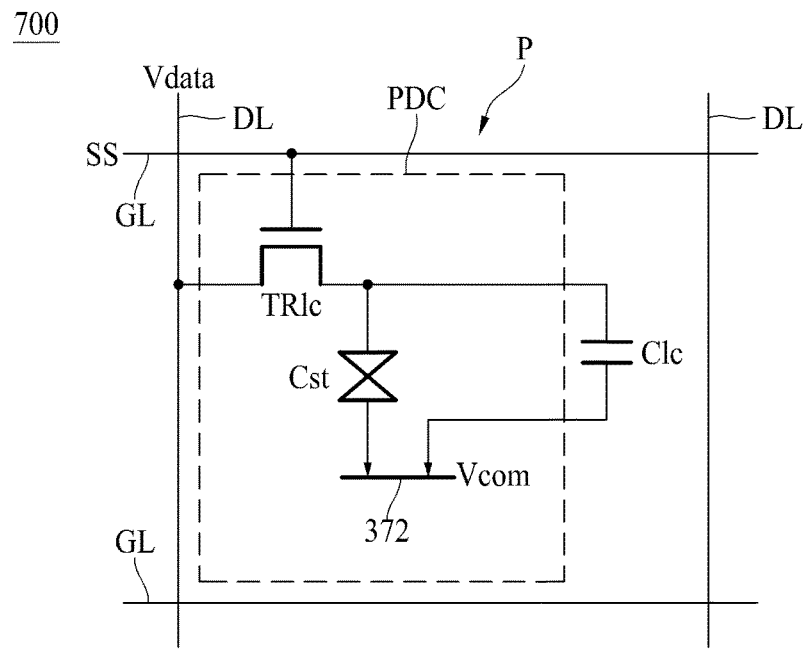
FIG. 12 is a circuit diagram for any one pixel of a display apparatus according to another embodiment of the present disclosure.
Figure 13:
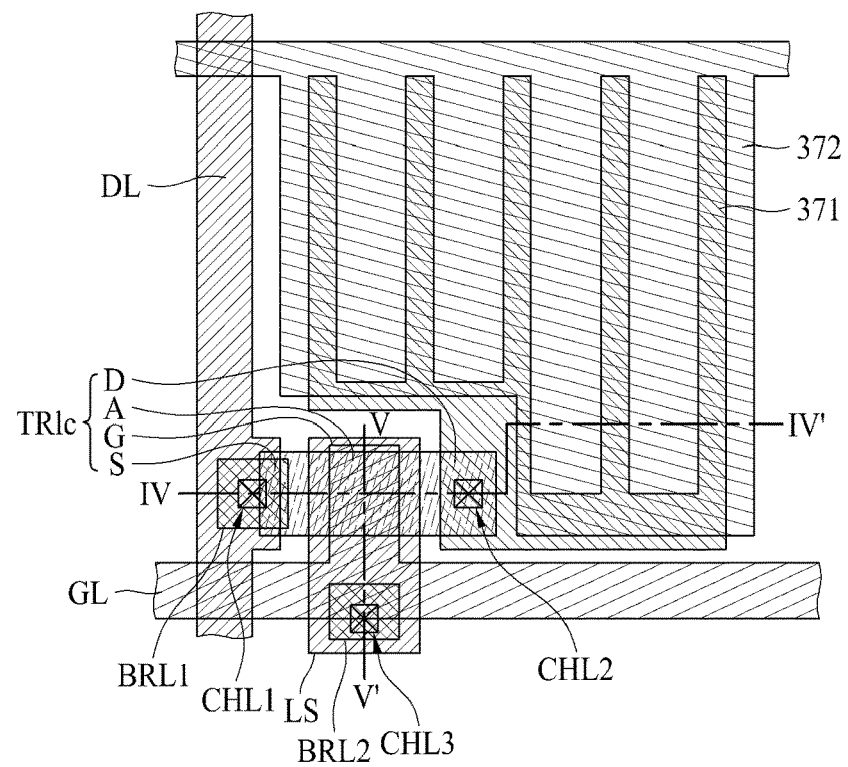
FIG. 13 is a plan view illustrating the pixel of FIG. 12.
Figure 14:
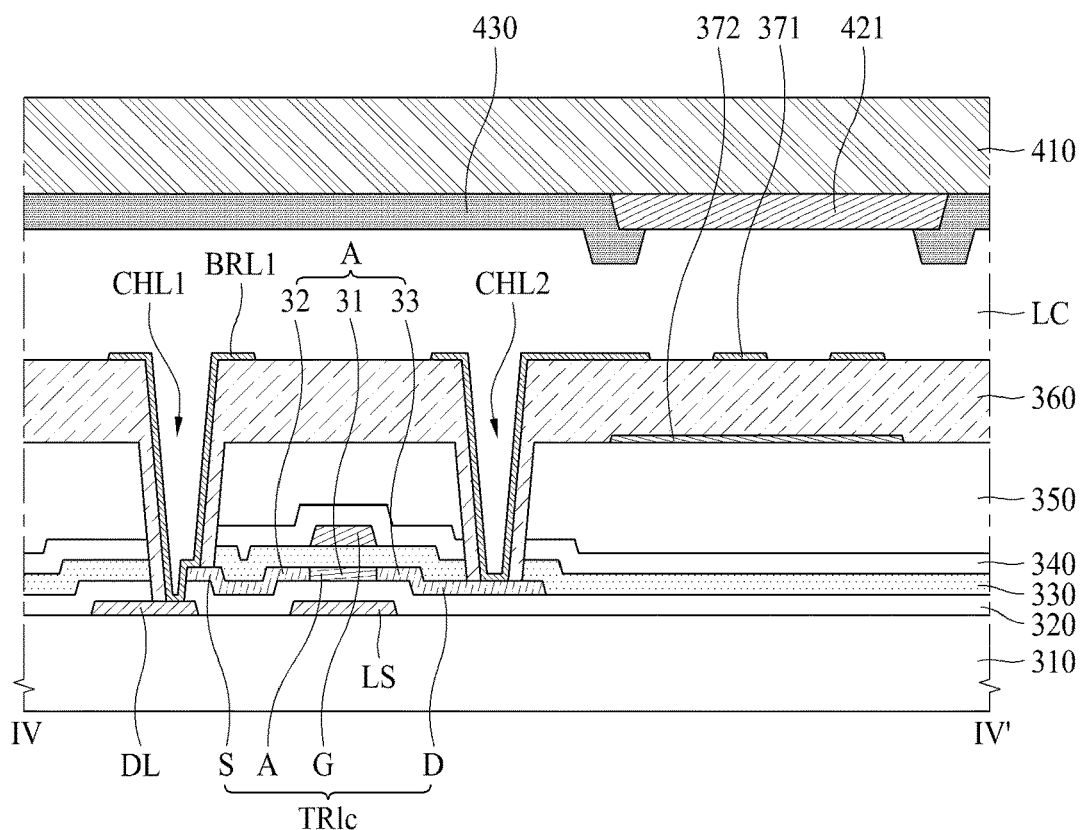
FIG. 14 is a cross sectional view along IV-IV' of FIG. 13.

FIG. 12 is a circuit diagram for any one pixel of a display apparatus 700 according to another embodiment of the present disclosure. FIG. 13 is a plan view illustrating the pixel of FIG. 12. FIG. 14 is a cross sectional view along IV-IV' of FIG. 13.

FIG. 12 is an equivalent circuit diagram for a pixel (P) of a liquid crystal display apparatus including liquid crystal (LC) serving as a display device. The display apparatus 700 of FIG. 12 corresponds to a liquid crystal display apparatus.

Referring to FIGS. 12, 13 and 14, the display apparatus 700 according to another embodiment of the present disclosure includes a substrate 310, a pixel driver (PDC) on the substrate 310, and a liquid crystal capacitor (C1c) connected with the pixel driver (PDC). Herein, the liquid crystal capacitor (C1c) corresponds to a display device. As shown in FIG. 12, the pixel (P) of the liquid crystal display apparatus may include the pixel driver (PDC), and the liquid crystal capacitor (C1c) corresponding to the display device.

The pixel driver (PDC) includes a thin film transistor (TR1c) connected with a gate line (GL) and a data line (DL), and a storage capacitor (Cst) connected between the thin film transistor (TR1c) and a second electrode 372 of the display device. The liquid crystal capacitor (C1c) is connected with the storage capacitor (Cst) in parallel between the thin film transistor (TR1c) and the second electrode 372.

The liquid crystal capacitor (C1c) corresponding to the display device is charged with a difference voltage between a data signal supplied to a first electrode 371 corresponding to a pixel electrode through the thin film transistor (TR1c) and a common voltage (Vcom) supplied to the second electrode 372 corresponding to a common electrode, and controls an amount of light transmittance by driving the liquid crystal in accordance with the charged voltage. The storage capacitor (Cst) stably maintains the voltage charged in the liquid crystal capacitor (C1c).

Referring to FIG. 14, the display apparatus 700 according to another embodiment of the present disclosure includes the substrate 310, a light shielding layer (LS) and a signal line (DL) on the substrate 310, a buffer layer 320 on the light shielding layer (LS) and the signal line (DL), an active layer (A) on the buffer layer 320, a gate insulating film 330 on the active layer (A), a gate electrode (G) on the gate insulating film 330, and the pixel electrode (first electrode) 371 on the gate electrode (G).

The substrate 310 may be formed of glass or plastic. The substrate 310 may be formed of plastic having flexibility, for example, polyimide (PI).

The light shielding layer (LS) and the data line (DL) corresponding to the signal line are disposed on the substrate 310.

The light shielding layer (LS) prevents externally-provided incident light, and protects the active layer (A).

According to the embodiment shown in FIG. 14, the signal line may include the data line (DL). Referring to FIG. 14, the data line (DL) is disposed on the same layer as that of the light shielding layer (LS).

The light shielding layer (LS) is formed of the same material as that of the data line (DL) corresponding to the signal line, and the light shielding layer (LS) and the data line (DL) may be manufactured by the same process.

In FIG. 14, the light shielding layer (LS) is spaced apart from the data line (DL) corresponding to the signal line, however, it is not limited to this structure. For example, the light shielding layer (LS) may be connected with the signal line (DL).

The buffer layer 320 is disposed on the light shielding layer (LS) and the data line (DL) corresponding to the signal line. The buffer layer 320 is formed of an insulating material, and the buffer layer 320 protects the active layer (A) from externally-provided moisture or oxygen. The buffer layer 320 may be formed of an insulating material, for example, silicon oxide or silicon nitride.

The active layer (A) of the thin film transistor (TR1c) is disposed on the buffer layer 320. At least some portions of the active layer (A) of the thin film transistor (TR1c) may be overlapped with the light shielding layer (LS).

According to one embodiment of the present disclosure, the active layer (A) may include an oxide semiconductor material. For example, the active layer (A) may include at least one among IZO(InZnO)-based oxide semiconductor, IGO(InGaO)-based oxide semiconductor, GO(GaO)-based oxide semiconductor, ITO(InSnO)-based oxide semiconductor, IGZO(InGaZnO)-based oxide semiconductor, IGTO(InGaSnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor. However, one embodiment of the present disclosure is not limited to the above materials. The active layer (A) may be formed of other oxide semiconductor materials generally known to those in the art.

However, one embodiment of the present disclosure is not limited to the above. The active layer (A) may have a multi-layered structure. In the same manner as FIG. 6, the active layer (A) may include a first oxide semiconductor layer on the buffer layer 320, and a second oxide semiconductor layer on the first oxide semiconductor layer. The first oxide semiconductor layer serves as a support layer configured to support the second oxide semiconductor layer, and the second oxide semiconductor layer serves as a channel layer. In this case, a channel of the active layer (A) is provided in the second oxide semiconductor layer, typically.

The first oxide semiconductor layer serving as the support layer may include at least one among IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material. The second oxide semiconductor layer may include at least one among IZO(InZnO)-based oxide semiconductor, IGO(InGaO)-based oxide semiconductor, ITO(InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor.

Referring to FIG. 14, the gate insulating film 330 is disposed on the active layer (A). The gate insulating film 330 has the insulating properties. The gate insulating film 330 may be patterned together with the gate electrode (G). However, in other embodiments, the gate insulating film 330 may not be patterned together with the gate electrode (G).

According to one embodiment of the present disclosure, as shown in FIG. 14, the gate insulating film 330 may be disposed on an entire upper surface of the substrate 310 including an upper surface of the active layer (A). In this case, the gate insulating film 330 is not patterned.

The gate electrode (G) is disposed on the gate insulating film 330. The gate electrode (G) may be the portions extended from the gate line (GL), or may be some portions of the gate line (GL). The gate electrode (G) may include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The gate electrode (G) may have a multi-layered structure including at least two layers with the different physical properties.

By a selective conducting process using the gate electrode (G) as a mask, some regions of the active layer (A) are provided with conductivity and thus become conducting regions.

A region of the active layer (A), which is overlapped with the gate electrode (G), is not provided with conductivity and thus does not become the conducting regions, but become a channel region 31. Some regions of the active layer (A), which are not overlapped with the gate electrode (G), are provided with conductivity and thus become the conducting regions 32 and 33. The conducting regions 32 and 33 may be formed at both sides with respect to the channel region 31.

According to one embodiment of the present disclosure, some regions of the active layer (A) may be provided with conductivity by a doping process using dopant and thus become conducting regions. In this case, doped regions become the conducting regions. The dopant may pass through the gate insulating film 330 and be doped to the some regions of the active layer (A). Thus, even though the active layer (A) is not exposed from the gate insulating film 330, a selective doping for the active layer (A) is possible. According to another embodiment of the present disclosure, it is possible not to pattern the gate insulating film 330.

Any one of the conducting regions 32 and 33 becomes a source region 32, and the other becomes a drain region 33. The source region 32 serves as a source connection region connected with the source electrode (S), or the source region 32 itself serves as the source electrode (S). The drain region 33 serves as a drain connection region connected with the drain electrode (D), or the drain region 33 itself serves as the drain electrode (D).

The source region 32 and the drain region 33 shown in FIG. 14 are distinguished from each other, for convenience of explanation. However, the source region 32 and the drain region 33 are used interchangeably. According to a voltage, the source region 32 may become the drain region 33, and the drain region 33 may become the source region 32. Also, the source region 32 may become the source electrode (S) or the drain electrode (D), and the drain region 33 may become the drain electrode (D) or the source electrode (S).

For convenience of explanation, in FIG. 14, the source region 32 is referred to as the source electrode (S), and the drain region 33 is referred to as the drain electrode (D).

Referring to FIG. 14, a passivation layer 340 is disposed on the gate electrode (G). The passivation layer 340 protects the active layer (A) and the gate electrode (G).

According to another embodiment of the present disclosure, additional source and drain electrodes are not disposed on the passivation layer 340. Thus, according to another embodiment of the present disclosure, it is possible to omit a patterning process for forming the source electrode and the drain electrode. As a result, it is possible to simplify a manufacturing process of the display apparatus 700.

A protection layer 350 is disposed on the passivation layer 340. The protection layer 350 is provided to planarize upper surfaces of the gate electrode (G), and to protect the pixel driver (PDC), whereby the protection layer 350 may be referred to as a planarization layer.

Referring to FIG. 14, the second electrode 372 of the display device is disposed on the protection layer 350. A common voltage is applied to the second electrode 372. Thus, the second electrode 372 may be referred to as a common electrode.

An insulating interlayer 360 is disposed on the second electrode 372, and the first electrode 371 of the display device (C1c) is disposed on the insulating interlayer 360.

The first electrode 371 and the second electrode 372 may be interchanged in position. In another embodiment of the present disclosure shown in FIGS. 12 to 14, the liquid crystal capacitor (C1c) serves as the display device of the display apparatus 700, and the display device includes the first electrode 371 corresponding to the pixel electrode, the second electrode 372 corresponding to the common electrode, and liquid crystal layer (LC).

Also, referring to FIGS. 13 and 14, the first electrode 371 has a line-shaped electrode type, and the second electrode 372 has a surface-shaped electrode type, but not limited to these types. For example, the first electrode 371 may have a surface-shaped electrode type, and the second electrode 372 may have a line-shaped electrode type. In another way, both the first and second electrodes 371 and 372 may have a line-shaped electrode type, or both the first and second electrodes 371 and 372 may have a surface-shaped electrode type.

Referring to FIG. 14, the first electrode 371 is connected with the active layer (A) via a contact hole (CH2). In detail, the first electrode 371 is directly connected with the active layer (A) via the contact hole (CH2) formed in the insulating interlayer 360, the protection layer 350, the passivation layer 340, and the gate insulating film 330.

A connection electrode (BRL1) is disposed on the insulating interlayer 360.

The connection electrode (BRL1) is formed of the same material as that of the first electrode 371 corresponding to the pixel electrode, and the connection electrode (BRL1) may be disposed on the same layer as that of the first electrode 371. The connection electrode (BRL1) and the first electrode 371 may be manufactured together by the same process using the same material.

The connection electrode (BRL1) connects the active layer (A) with the data line (DL) corresponding to the signal line. Referring to FIG. 14, a contact hole (CRL1) is provided in order to connect the data line (DL) and the active layer (A) with each other.

The liquid crystal layer (LC) is disposed on the first electrode 371. In detail, the liquid crystal layer (LC) is disposed between the substrate 310 and its confronting substrate 410.

Referring to FIG. 14, a color filter 421 is disposed on the confronting substrate 410, and a black matrix 430 is disposed between each color filter 421. The black matrix 430 is provided to divide each pixel area.

In FIG. 14, the color filter 421 is disposed on the confronting substrate 410, but not limited to this structure. For instance, the color filer 421 may be disposed on the substrate 310.

According to one embodiment of the present disclosure, the thin film transistor (TR1c) is formed by the active layer (A) and the gate electrode (G). In the thin film transistor (TR1c), the source region 32 of the active layer (A) becomes the source electrode (S), and the drain region 33 becomes the drain electrode (D).

In the thin film transistor (TR1c) shown in FIG. 14, the active layer (A) is disposed between the gate electrode (G) and the substrate 310. As shown in FIG. 14, if the substrate 310 is the bottom, a structure of the thin film transistor where the gate electrode (G) is disposed above the active layer (A) is referred to as a top gate structure.

In comparison to a bottom gate structure, the thin film transistor of the top gate structure has an advantage of a relatively small power consumption. Also, in case of the thin film transistor according to another embodiment of the present disclosure, it does not require an additional process for forming the source and drain electrodes. Accordingly, even though top gate structure is adopted in another embodiment of the present disclosure, it is possible to decrease the number of steps for forming the thin film transistors (TR1c), and also to decrease the number of deposited layers, whereby the number of contact holes is decreased, to thereby lower a manufacturing cost and to decrease an occupying size of the thin film transistor.

According to another embodiment of the present disclosure, even though top gate structure is adopted, it is possible to improve an aperture ratio of the display apparatus 700.

Figure 15:
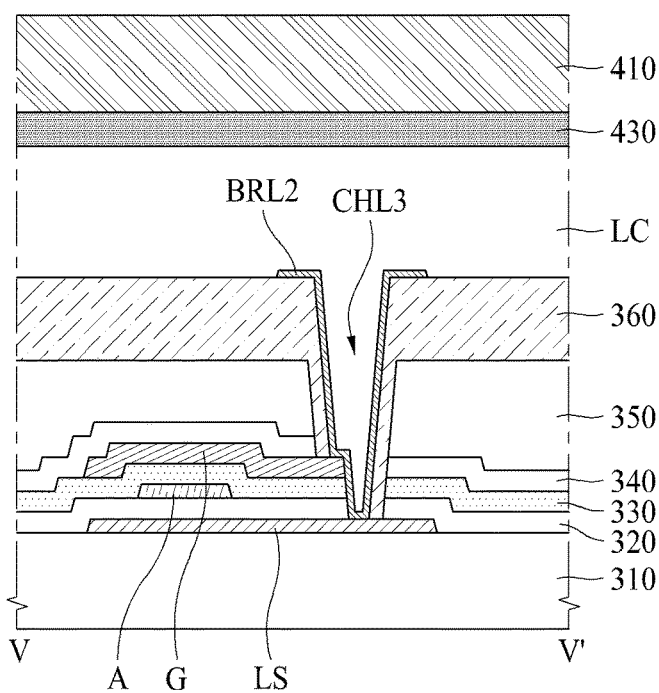
FIG. 15 is a cross sectional view along V-V' of FIG. 13.

FIG. 15 is a cross sectional view along V-V' of FIG. 13.

Referring to FIG. 15, the light shielding layer (LS) is connected with the gate electrode (G) by the use of connection electrode (BRL2). A contact hole (CHL3) is provided to connect the light shielding layer (LS) with the gate electrode (G).

According as the light shielding layer (LS) is connected with the gate electrode (G), it is possible to prevent the light shielding layer (LS) from being left in an unstable floating state. Also, according as the light shielding layer (LS) is connected with the gate electrode (G), it may have an occurrence of effect that happens when the gate electrode is disposed at both sides of the active layer (A), whereby a turning-on current of the thin film transistor (TR1c) may be increased.

Figure 16:
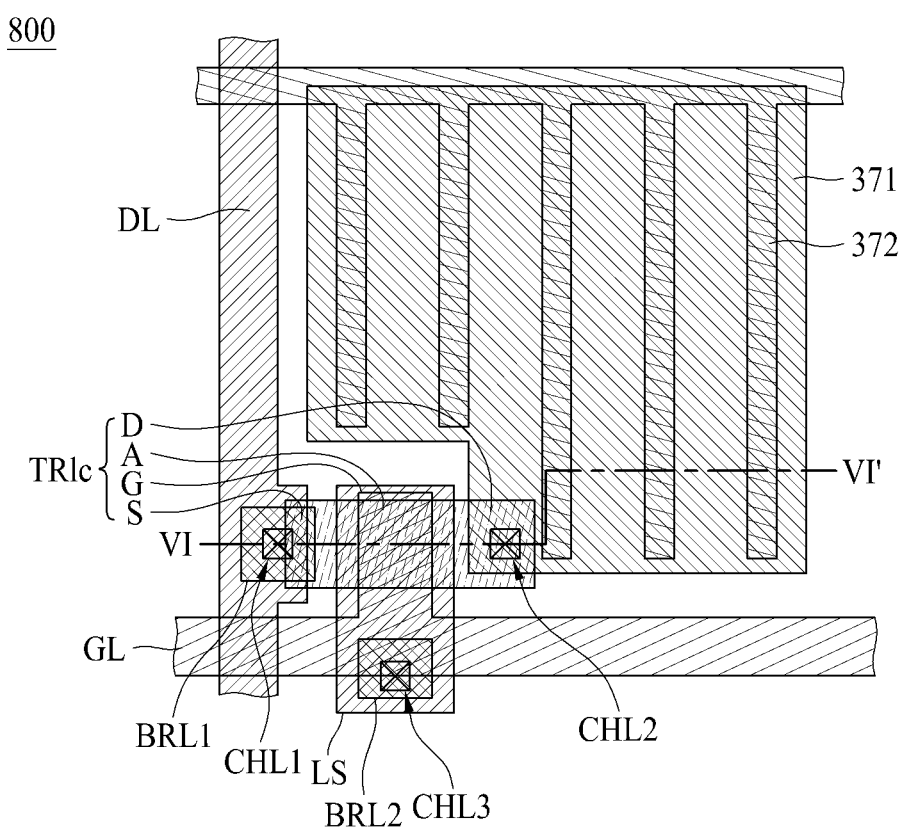
FIG. 16 is a plan view illustrating a pixel of a display apparatus according to another embodiment of the present disclosure.
Figure 17:
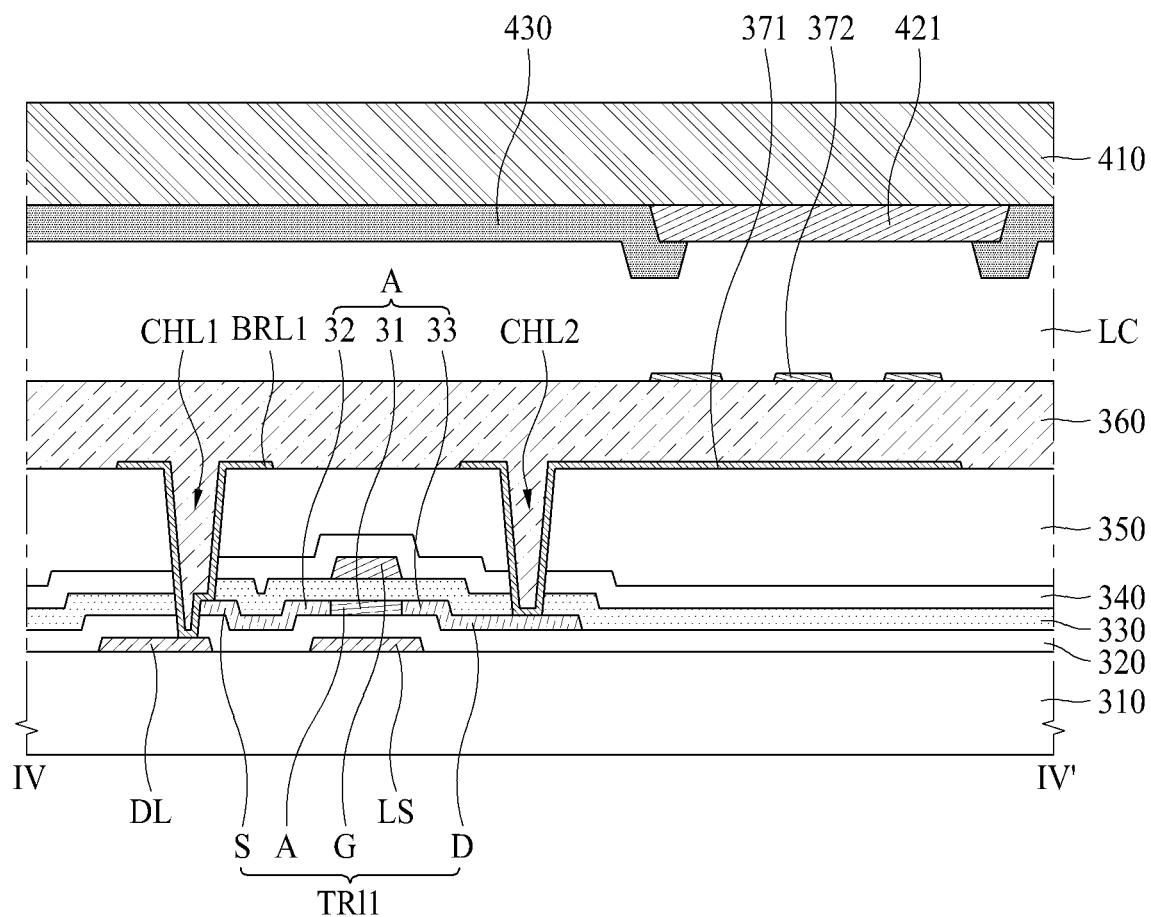
FIG. 17 is a cross sectional view along VI-VI' of FIG. 16.

FIG. 16 is a plan view illustrating a pixel of a display apparatus 800 according to another embodiment of the present disclosure. FIG. 17 is a cross sectional view along VI-VI' of FIG. 16.

Referring to FIGS. 16 and 17, a first electrode 371 corresponding to a pixel electrode is disposed on a protection layer 350, an insulating interlayer 360 is disposed on the first electrode 371, and a second electrode 372 of a display device may be disposed on the insulating interlayer 360.

Hereinafter, a method for manufacturing the display apparatus 100 according to one embodiment of the present disclosure will be described with reference to FIGS. 18A to 18G.

FIGS. 18A to 18G are cross sectional views illustrating a method for manufacturing the display apparatus according to one embodiment of the present disclosure.

First, referring to FIG. 18A, the light shielding layer (LS1, LS2) and the signal line (DL, PL) are disposed on the substrate 210. Some portions of the second light shielding layer (LS2) may be used as the first capacitor electrode (C11) of the first capacitor. The light shielding layer (LS1, LS2) and the signal line (DL, PL) may be manufactured together by the same process using the same material. In this case, a mask process using a photo mask may be carried out.

Referring to FIG. 18B, the buffer layer 220 is disposed on the light shielding layer (LS1, LS2) and the signal line (DL, PL), and the active layer (A1, A2) is disposed on the buffer layer 220. The active layer (A1, A2) includes the oxide semiconductor material. A mask process for forming the active layer (A1, A2) is carried out.

Figure 18C:
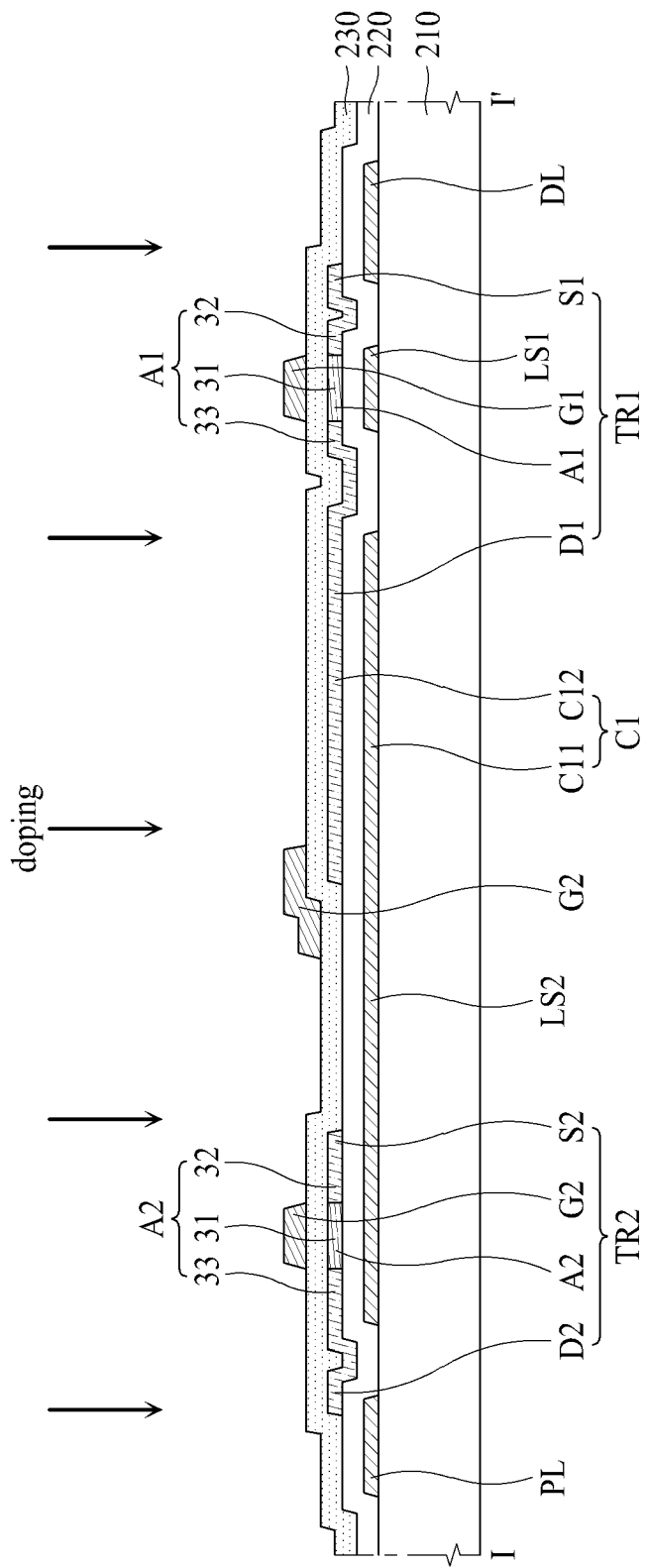

Referring to FIG. 18C, the gate insulating film 230 is formed on the active layer (A1, A2), and the gate electrode (G1, G2) is formed on the gate insulating film 230.

The gate insulating film 230 is disposed on the entire upper surface of the substrate 210 including the upper surface of the active layer (A1, A2). The gate insulating film 230 is not patterned.

A mask process for forming the gate electrode (G1, G2) is carried out.

Referring to FIG. 18C, the active layer (A1, A2) are selectively provided with conductivity by a doping process using the gate electrode (G1, G2) as a mask, and thus selectively become the conducting region. A portion of the active layer (A1, A2), which is overlapped with the gate electrode (G1, G2), is not provided with conductivity, and thus becomes the channel region 31. Some portions of the active layer (A1, A2), which are not overlapped with the gate electrode (G1, G2), become the conducting regions 32 and 33.

Figure 18D:
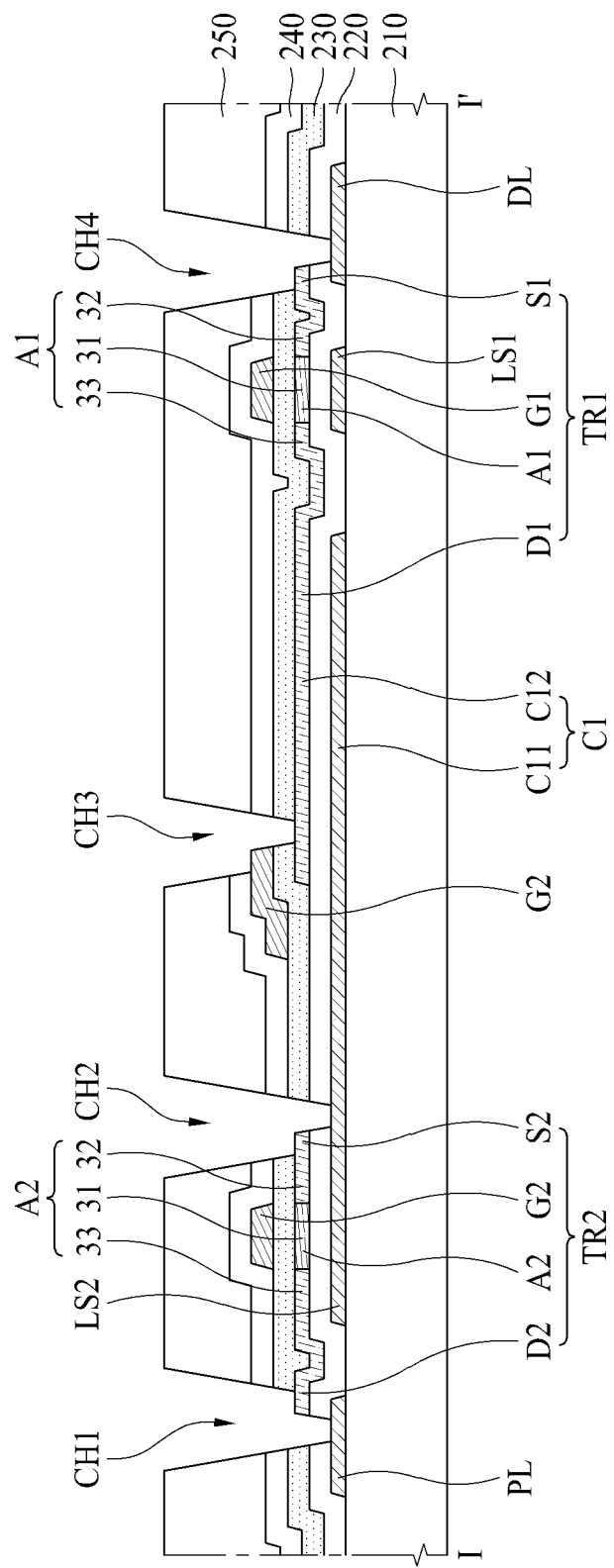

Referring to FIG. 18D, the passivation layer 240 is formed on the gate electrode (G1, G2), and the protection layer 250 is formed on the passivation layer 240. The contact hole (CH1, CH2, CH3, CH4) is formed in the protection layer 250. The contact hole (CH1, CH2, CH3, CH4) may penetrate through the protection layer 250, and furthermore may penetrate through at least one among the passivation layer 240, the gate insulating film 230, and the buffer layer 220.

A mask process for forming the contact hole (CH1, CH2, CH3, CH4) is carried out.

According to one embodiment of the present disclosure, it is possible to omit a process for forming a source electrode and a drain electrode on the passivation layer 240. Thus, according to one embodiment of the present disclosure, it is possible to omit at least one mask process for forming the source electrode and drain electrode. As a result, a process for manufacturing the display apparatus 100 may be more simplified.

Figure 18E:
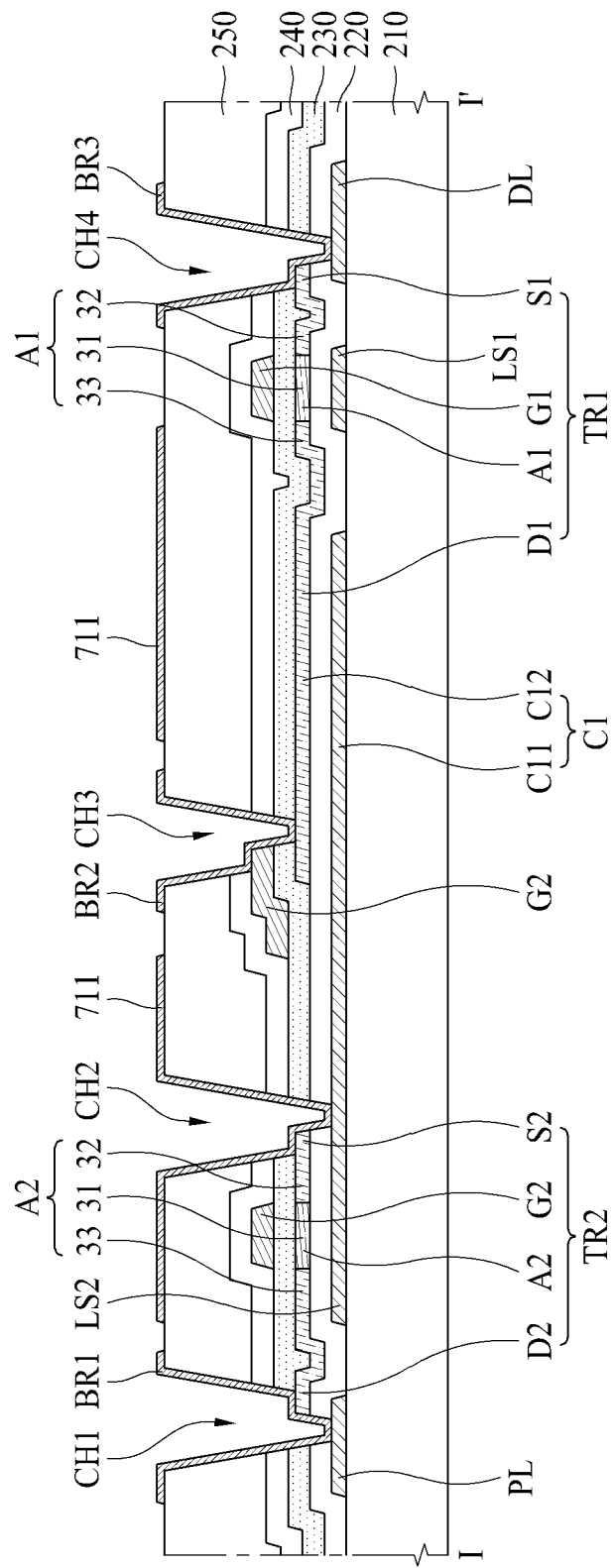

Referring to FIG. 18E, the first electrode 711 of the display device 710 is formed on the protection layer 250. The connection electrode (BR1, BR2, BR3) and the first electrode 711 of the display device 710 may be manufactured simultaneously.

The connection electrode (BR1, BR2, BR3) and the first electrode 711 may be formed of the same material, and may be disposed on the same layer. The connection electrode (BR1, BR2, BR3) and the first electrode 711 may be manufactured by the same process. A mask process for forming the connection electrode (BR1, BR2, BR3) and the first electrode 711 of the display device 710 is carried out.

The signal line (DL, PL) and the active layer (A1, A2) may be connected with each other by the use of connection electrode (BR1, BR3).

Referring to FIGS. 18D and 18E, the connection electrode may be formed in at least some portions of the contact hole penetrating through some portions of the protection layer 250, the gate insulating film 230, and the buffer layer 220.

In more detail, the first contact hole (CH1) which penetrates through some portions of each of the protection layer 250, the passivation layer 240, the gate insulating film 230, and the buffer layer 220 is formed to expose at least some portions of the driving power line (PL) and the second active layer (A2), and a conductive film whose material is the same as that of the first electrode 711 of the display device 710 is disposed in at least some portions of the first contact hole (CH1), to thereby form the first connection electrode (BR1) configured to connect the driving power line (PL) and the second active layer (A2) with each other.

The fourth contact hole (CH4) which penetrates through some portions of each of the protection layer 250, the passivation layer 240, the gate insulating film 230, and the buffer layer 220 is formed to expose at least some portions of the data line (DL) and the first active layer (A1), and a conductive film whose material is the same as that of the first electrode 711 is disposed in at least some portions of the fourth contact hole (CH4), to thereby form the third connection electrode (BR3) configured to connect the data line (DL) and the first active layer (A1) with each other.

The first electrode 711 extends to at least some portions of the contact hole (CH2) penetrating through the protection layer 250, the gate insulating film 230, and the buffer layer 220, and then the first electrode 711 may be directly connected with the light shielding layer (LS2) and the active layer (A2).

In more detail, the second contact hole (CH2) which penetrates through some portions of each of the protection layer 250, the passivation layer 240, the gate insulating film 230, and the buffer layer 220 is formed to expose both at least a portion of the second light shielding layer (LS2) and at least a portion of the second active layer (A2), and the first electrode 711 extends to the second contact hole (CH2), whereby the first electrode 711 may be in direct contact with the second light shielding layer (LS2) and the second active layer (A2).

Figure 18F:
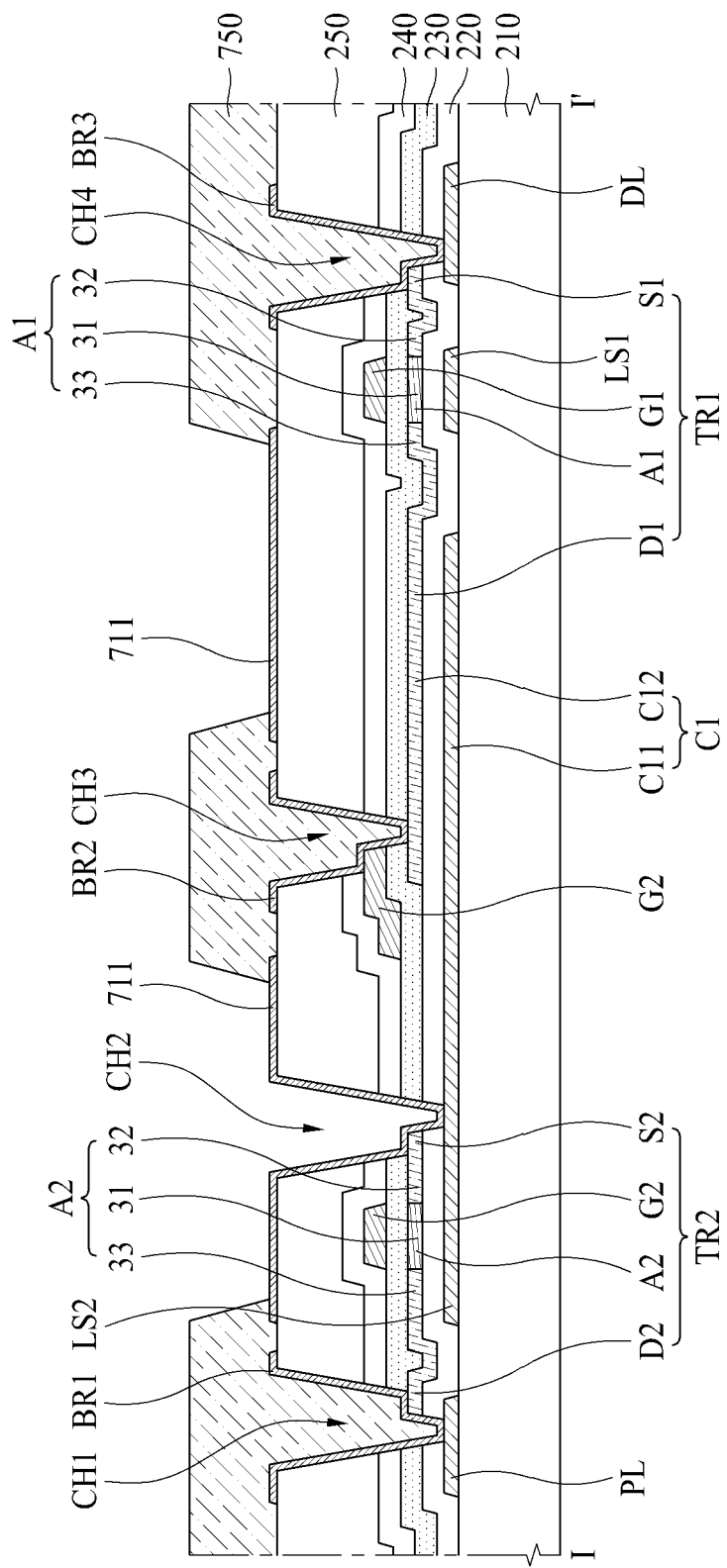

Referring to FIG. 18F, the bank layer 750 is disposed on the periphery of the first electrode 711. A mask process for forming the bank layer 750 is carried out.

Figure 18G:
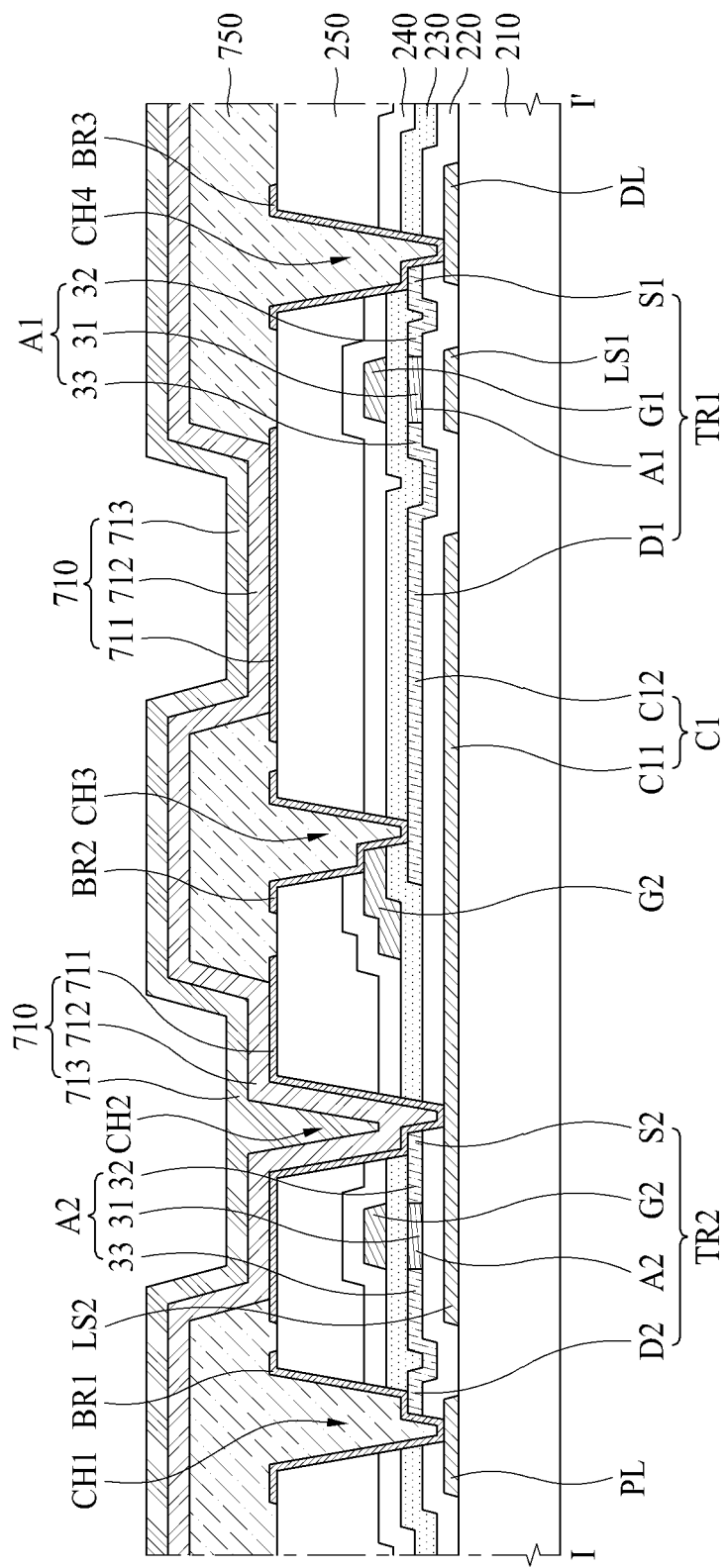

Referring to FIG. 18G, the emission layer 712 and the second electrode 713 are sequentially disposed on the first electrode 711, to thereby form the display device 710.

In the display apparatus according to one embodiment of the present disclosure, the light shielding layer and the signal line are disposed on the same layer, and are manufactured by the same process. Thus, it is unnecessary to provide an additional mask process for forming the light shielding layer for the manufacturing process of the display apparatus.

Also, according to one embodiment of the present disclosure, the signal line and the active layer of the thin film transistor may be connected by the use of connection electrode formed by the process for forming the first electrode of the display device. Thus, in the manufacturing process of the display apparatus, it is unnecessary to carry out an additional mask process for forming the source electrode and the drain electrode of the thin film transistor.

Thus, according to the embodiments of the present disclosure, it is possible to provide the display apparatus with the simplified structure, and the method for manufacturing the display apparatus with the simplified process.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure includes all variations or modifications derived from the meaning, scope, and equivalent concept of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
   a substrate;
   a light shielding layer and a signal line on the substrate;
   a buffer layer on the light shielding layer and the signal line;
   an active layer on the buffer layer;
   a gate insulating film on the active layer;
   a gate electrode on the gate insulating film;
   a protection layer on the gate electrode;
   a first electrode on the protection layer; and
   a connection electrode configured to connect the signal line and the active layer with each other,
   wherein the light shielding layer and the signal line are disposed on the same layer, and
   wherein the connection electrode and the first electrode are formed of the same material, and
   wherein the connection electrode contacts an upper surface of the signal line and a lateral surface of the active layer.

2. The display apparatus according to claim 1, wherein the connection electrode is disposed on the same layer as that of the first electrode.

3. The display apparatus according to claim 2, wherein the light shielding layer is formed of the same material as that of the signal line.

4. The display apparatus according to claim 1, wherein the signal line includes at least one of a data line and a driving power line.

5. The display apparatus according to claim 1, wherein the light shielding layer is connected with the signal line.

6. The display apparatus according to claim 1, wherein the light shielding layer and the signal line are formed as one body.

7. The display apparatus according to claim 1, wherein the gate insulating film is disposed on an upper surface of the substrate including an upper surface of the active layer.

8. The display apparatus according to claim 7, wherein the gate insulating film is disposed on an entire upper surface of the substrate including an upper surface of the active layer.

9. The display apparatus according to claim 1, wherein the active layer is disposed between the gate electrode and the substrate.

10. The display apparatus according to claim 1, wherein the active layer includes an oxide semiconductor material.

11. The display apparatus according to claim 1, wherein the active layer includes:
a first oxide semiconductor layer on the buffer layer; and
a second oxide semiconductor layer on the first oxide semiconductor layer.

12. The display apparatus according to claim 1, further comprising an emission layer disposed on the first electrode.

13. The display apparatus according to claim 12, further comprising a capacitor connected with the first electrode, wherein any one electrode of the capacitor is formed as one body with the light shielding layer.

14. The display apparatus according to claim 13, wherein the first electrode is directly connected with the light shielding layer and the active layer.

15. The display apparatus according to claim 1, further comprising a liquid crystal layer disposed on the first electrode.

16. A method for manufacturing a display apparatus, comprising:
forming a light shielding layer and a signal line on a substrate;
forming a buffer layer on the light shielding layer and the signal line;
forming an active layer on the buffer layer;
forming a gate insulating film on the active layer;
forming a gate electrode on the gate insulating film;
selectively providing conductivity to the active layer;
selectively making a conducting region in the active layer by using the gate electrode as a mask;
forming a protection layer on the gate electrode;
forming a first electrode of a display device on the protection layer; and
forming a connection electrode configured to connect the signal line and the active layer with each other,
wherein forming a light shielding layer and a signal line on a substrate includes:
forming the light shielding layer and the signal line by the same process; and
forming the light shielding layer and the signal line using the same material, and
wherein the connection electrode and the first electrode are formed by the same process using the same material, and
wherein the connection electrode contacts an upper surface of the signal line and a lateral surface of the active layer.

17. The method according to claim 16, wherein selectively making the conducting region in the active layer is carried out by a doping process.

18. The method according to claim 16, wherein the connection electrode is formed in at least some portions of a contact hole penetrating through some portions of each of the protection layer, the gate insulating film and the buffer layer.

19. The method according to claim 16, wherein the first electrode extends to at least some portions of a contact hole penetrating through some portions of each of the protection layer, the gate insulating film and the buffer layer, and the first electrode is directly connected with the light shielding layer and the active layer.

20. A display apparatus, comprising:
a substrate;
a light shielding layer and a signal line on the substrate;
a buffer layer on the light shielding layer and the signal line;
a transistor including an active layer, a source electrode, a gate electrode, and a drain electrode, the active layer on the buffer layer;
a gate insulating film on the active layer;
a protection layer on the gate electrode, the protection layer having a first surface;
a first electrode on the first surface of the protection layer, the first electrode having a second surface and a third surface spaced apart from the first surface of the protection layer;
a connection electrode configured to connect the signal line and the active layer with each other,
wherein the gate electrode is on the gate insulating film,
wherein the light shielding layer and the signal line are disposed on the same layer,
wherein the connection electrode and the first electrode are formed of the same material, and
wherein the third surface of the first electrode is closer to the buffer layer than the second surface of the first electrode.

* * * * *